United States Patent
Baumgartner et al.

(10) Patent No.: US 7,370,298 B2
(45) Date of Patent: *May 6, 2008

(54) METHOD FOR HEURISTIC PRESERVATION OF CRITICAL INPUTS DURING SEQUENTIAL REPARAMETERIZATION

(75) Inventors: Jason Raymond Baumgartner, Austin, TX (US); Geert Janssen, Putnam Valley, NY (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 353 days.

This patent is subject to a terminal disclaimer.

(21) Appl. No.: 11/105,617

(22) Filed: Apr. 14, 2005

(65) Prior Publication Data

US 2006/0248482 A1    Nov. 2, 2006

(51) Int. Cl.
    G06F 17/50 (2006.01)
(52) U.S. Cl. .................... 716/4; 716/5; 716/18
(58) Field of Classification Search ............. 716/1–6, 716/18; 703/13–22
    See application file for complete search history.

(56) References Cited

U.S. PATENT DOCUMENTS

| | | | |
|---|---|---|---|
| 6,587,998 B2 * | 7/2003 | Rodeh ............................ | 716/5 |
| 7,117,463 B2 * | 10/2006 | Graham et al. ................. | 716/5 |
| 7,159,198 B1 * | 1/2007 | Ip et al. ........................... | 716/5 |
| 7,299,432 B2 * | 11/2007 | Baumgartner et al. ......... | 716/4 |
| 2005/0114809 A1 * | 5/2005 | Lu ................................... | 716/5 |

OTHER PUBLICATIONS

Kukula et al., Computer Aided Verification, 12th International Conference on Computer Aided Verification, Jul. 15-19, 2000.
Moon et al., Simplifying Circuits for Formal Verification Using Parametric Representation, Formal Methods in Computer-Aided Design, 2002, pp. 52-69.
Yuan et al., Constraint Synthesis for Environment Modeling in Functional Verification, Design Automation Conference, Jun. 2-6, 2003.

* cited by examiner

*Primary Examiner*—Jack Chiang
*Assistant Examiner*—Nghia M. Doan
(74) *Attorney, Agent, or Firm*—Casimer K. Salys; Dillon & Yudell LLP

(57) ABSTRACT

A method, system, and computer program product for preserving critical inputs. According to an embodiment of the present invention, an initial design including one or more primary inputs which cannot be eliminated, one or more primary inputs which can be eliminated, one or more targets, and one or more state elements are received. A cut of said initial design including one or more cut gates is identified, and a relation of one or more values producible to said one or more cut gates in terms of said one or more primary inputs which cannot be eliminated, said one or more primary inputs which can be eliminated and said one or more state elements is computed. Said relation is synthesized to form a gate set, and an abstracted design is formed from said gate set. Verification is performed on said abstracted design to generate verification results.

7 Claims, 11 Drawing Sheets

| Fig. 5 |
|---|
| Fig. 5A |
| Fig. 5B |
| Fig. 5C |
| Fig. 5D |
| Fig. 5E |

Fig. 5A

Start 500

502 — Receive BDD B over quantifiable BDD variables Q and nonquantifiable BDD variables X, in addition to mapping n (X) between nonquantifiable variables and gates of a design 504 — For each quantifiable variable q in Q, create a random gate n (q)

Set up preliminary data structures for B 506

508 — Traverse each child node of B recursively from root to leaves, tracking whether an even or odd number of "inverted" handles were encountered between the root and node b, and neglecting to traverse the children of the same node more than once 510 — For each b encountered, if through an even number of inverted handles, enqueue that node in Vars_To_Nodes (v). If through an odd number of inverted handles, enqueue the inverse of that node in Vars_To_Nodes(v)

METHOD FOR HEURISTIC PRESERVATION OF CRITICAL INPUTS DURING SEQUENTIAL REPARAMETERIZATION

CROSS-REFERENCE TO RELATED APPLICATIONS

The present application is related to the following co-pending U.S. patent applications filed on even date herewith, and incorporated herein by reference in their entirety:

Ser. No. 11/105,615, entitled "METHOD AND SYSTEM FOR PARAMETRIC REDUCTION OF SEQUENTIAL DESIGNS";

Ser. No. 11/105,616, entitled "METHOD AND SYSTEM FOR REVERSING THE EFFECTS OF SEQUENTIAL REPARAMETERIZATION ON TRACES";

Ser. No. 11/105,611, entitled "METHOD FOR PRESERVING CONSTRAINTS DURING SEQUENTIAL REPARAMETERIZATION"; and Ser. No. 11/105,618, entitled "METHOD FOR OPTIMAL SYNTHESIS OF BINARY DECISION DIAGRAMS WITH INVERTED EDGES AND QUANTIFIABLE AS WELL AS NONQUANTIFIABLE VARIABLES".

BACKGROUND OF THE INVENTION

1. Technical Field

The present invention relates in general to verifying designs and in particular to representing a logic function in a decision diagram. Still more particularly, the present invention relates to a system, method and computer program product for performing parametric reduction of sequential designs.

2. Description of the Related Art

With the increasing penetration of processor-based systems into every facet of human activity, demands have increased on the processor and application-specific integrated circuit (ASIC) development and production community to produce systems that are free from design flaws. Circuit products, including microprocessors, digital signal and other special-purpose processors, and ASICs, have become involved in the performance of a vast array of critical functions, and the involvement of microprocessors in the important tasks of daily life has heightened the expectation of error-free and flaw-free design. Whether the impact of errors in design would be measured in human lives or in mere dollars and cents, consumers of circuit products have lost tolerance for results polluted by design errors. Consumers will not tolerate, by way of example, miscalculations on the floor of the stock exchange, in the medical devices that support human life, or in the computers that control their automobiles. All of these activities represent areas where the need for reliable circuit results has risen to a mission-critical concern.

In response to the increasing need for reliable, error-free designs, the processor and ASIC design and development community has developed rigorous, if incredibly expensive, methods for testing and verification for demonstrating the correctness of a design. The task of hardware verification has become one of the most important and time-consuming aspects of the design process.

Among the available verification techniques, formal and semiformal verification techniques are powerful tools for the construction of correct logic designs. Formal and semiformal verification techniques offer the opportunity to expose some of the probabilistically uncommon scenarios that may result in a functional design failure, and frequently offer the opportunity to prove that the design is correct (i.e., that no failing scenario exists).

Unfortunately, the resources needed for formal verification, or any verification, of designs are proportional to design size. Formal verification techniques require computational resources which are exponential with respect to the design under test. Similarly, simulation scales polynomially and emulators are gated in their capacity by design size and maximum logic depth. Semi-formal verification techniques leverage formal methods on larger designs by applying them only in a resource-bounded manner, though at the expense of incomplete verification coverage. Generally, coverage decreases as design size increases.

One commonly-used approach to formal and semiformal analysis for applications operating on representations of circuit structures is to represent the underlying logical problem structurally (as a circuit graph), and then use Binary Decision Diagrams (BDDs) to convert the structural representation into a functionally canonical form. In such an approach, in which a logical problem is represented structurally and binary decision diagrams are used to convert the structural representation into a functionally canonical form, a set of nodes for which binary decision diagrams are required to be built, called "sink" nodes, is identified. Examples of sink nodes include the output node or nodes in an equivalence checking or a false-paths analysis context. Examples of sink nodes also include targets in a property-checking or model-checking context.

Techniques for reducing the size of a design representation have become critical in numerous applications. Logic synthesis optimization techniques are employed to attempt to render smaller designs to enhance chip fabrication processes. Numerous techniques have been proposed for reducing the size of a structural design representation. For example, redundancy removal techniques attempt to identify gates in the design which have the same function, and merge one onto the other. Such techniques tend to rely upon binary decision diagram-based or Boolean satisfiability-based analysis to prove redundancy, which tend to be computationally expensive. Further, the prior art provides inadequate facilities for the preservation of critical inputs.

What is needed is a method for heuristic preservation of critical inputs during reparameterization.

SUMMARY OF THE INVENTION

A method, system, and computer program product for preserving critical inputs is disclosed. The method comprises receiving an initial design including one or more primary inputs which cannot be eliminated, one or more primary inputs which can be eliminated, one or more targets, and one or more state elements. A cut of said initial design including one or more cut gates is identified, and a relation of one or more values producible to said one or more cut gates in terms of said one or more primary inputs which cannot be eliminated, said one or more primary inputs which can be eliminated and said one or more state elements is computed. Said relation is synthesized to form a gate set, and an abstracted design is formed from said gate set. Verification is performed on said abstracted design to generate verification results.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed descriptions of an illustrative embodiment when read in conjunction with the accompanying drawings, wherein:

DETAILED DESCRIPTION OF THE PREFERRED EMBODIMENT

The present invention provides a method, system, and computer program product for parametric reduction of a structural design representation. As will be explained below, the present invention identifies a candidate set of gates of a netlist representation, particularly, a cut of a netlist graph, to attempt to re-encode. The present invention then creates a behaviorally equivalent piece of logic, and replaces the original cut with this new piece of logic, i.e., the present invention replaces each cut gate in the original design by a gate in the replacement logic.

Figure 1:
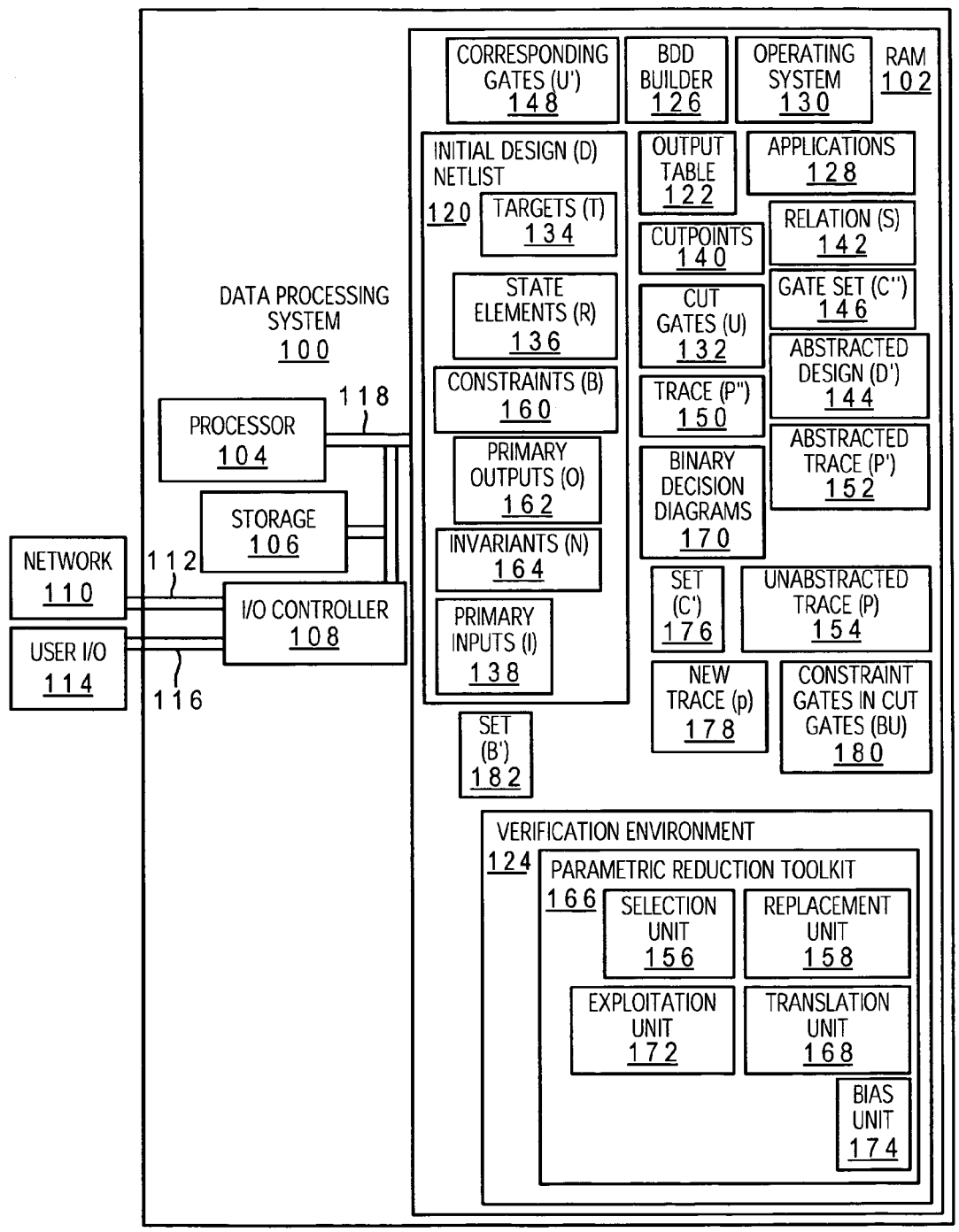
FIG. 1 depicts a block diagram of a general-purpose data processing system with which the present invention of a method, system and computer program product for performing parametric reduction of sequential designs may be performed.

With reference now to the figures, and in particular with reference to FIG. 1, a block diagram of a general-purpose data processing system, in accordance with a preferred embodiment of the present invention, is depicted. Data processing system 100 contains a processing storage unit (e.g., RAM 102) and a processor 104. Data processing system 100 also includes non-volatile storage 106 such as a hard disk drive or other direct-access storage device. An Input/Output (I/O) controller 108 provides connectivity to a network 110 through a wired or wireless link, such as a network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions while operating in accordance with a preferred embodiment of the present invention. These include an initial design (D) netlist 120, a binary decision diagram builder 126 and an output table 122 for interaction with a verification environment 124. In the embodiment shown in FIG. 1, initial design (D) netlist 120 contains targets (T) 134 state elements (R) 136 and primary inputs (I) 138. Other applications 128 and verification environment 124 interface with processor 104, RAM 102, I/O control 108, and storage 106 through operating system 130. One skilled in the data processing arts will quickly realize that additional components of data processing system 100 may be added to or substituted for those shown without departing from the scope of the present invention. Other data structures in RAM 102 include binary decision diagrams 170, cut gates 132, cutpoints 140, relation (S) 142, abstracted design (D') 144, gate set (C'') 146, corresponding gates (U') 148, trace (P''') 150, abstracted trace (P') 152, unabstracted trace (P) 154, set (C') 176, constraint gates in cut gates (BU) 180, set (B') 182 and new trace (p) 178.

A netlist, such as design (D) netlist 120, is a popular means of compactly representing problems derived from circuit structures in the computer-aided design of digital circuits. Such a representation is non-canonical and offers the ability to analyze the function from the nodes in the graph. Initial design (D) netlist 120, contains a directed graph with vertices representing gates and edges representing interconnections between those gates. The gates have associated functions, such as constants, primary inputs (I) 138 (e.g. RANDOM gates, which deliver random values at the given input), combinational logic (e.g., AND gates), and sequential elements (hereafter referred to as registers). Registers have two associated components; their next-state functions and their initial-value functions, which are represented as other gates in the graph. Certain gates in the netlist may be labeled as primary outputs (O) 162, invariants (N) 164, targets (T) 134 and constraints (B) 160.

Semantically, for a given register, the value appearing at its initial-value gate at time "0" ("initialization" or "reset" time) will be applied by verification environment 124 as the value of the register itself; the value appearing at its next-state function gate at time "i" will be applied to the register itself at time "i+1". Certain gates are labeled as targets (T) 134 or constraints (B) 160. Targets (T) 134 correlate to the properties that require verification. Constraints (B) 160 are used to artificially limit the stimulus that can be applied to the RANDOM gates of initial design (D) netlist 120; in particular, when searching for a way to drive a "1" to a target (T) 134, the verification environment 124 must adhere to rules such as, for purpose of example, that "every constraints (B) 160 gate must evaluate to a logical 1 for every time-step" or "every constraints (B) 160 gate must evaluate to a logical 1 for every time-step up to, and including, the time-step at which the target is asserted." For example, in verification environment 124, a constraints (B) 160 could be added which drives a 1 exactly when a vector of RANDOM gates to simulate even parity. Without its constraints (B) 160, the verification environment 124 would consider valuations with even or odd parity to those RANDOM gates; with the constraints (B) 160, only even parity would be explored.

Invariants (N) 164 are similar to constraints in the sense that they will always evaluate to a "1". However, unlike constraints (B) 160, they will naturally evaluate to a 1 even if discarded from the problem formulation (i.e., they are redundant facts about the way the design will behave due to its structural definition). These redundant facts may be useful in formal verification to obtain proofs of correctness. For example, an invariant (N) 164 node could assert that a set of registers always evaluates to even parity; that fact may help the performance of proof-based techniques.

Processor 104 executes instructions from programs, often stored in RAM 102, in the course of performing the present invention. In a preferred embodiment of the present invention, processor 104 executes verification environment 124. Verification environment 124 contains a parametric reduction toolkit 166, including a selection unit 156, a replacement unit 158, a translation unit 168, exploitation unit 172 and bias unit 174.

Initial design (D) netlist 120 includes replaceable gates and gates within the cone of influence of each replaceable gate. For example, assume the existence within initial design (D) netlist 120 of replaceable gates G1 and G2, each of which has a cone of influence including combinational logic as well as registers. Parametric reduction toolkit 166 is tuned to abstract logic within initial design (D) netlist 120 which is combinationally driven by RANDOM gates, and hence is less likely to abstract any logic within initial design (D) netlist 120 which is not combinationally driven by RANDOM gates. When performing an abstraction to replace gates G1 and G2 within initial design (D) netlist 120, parametric reduction toolkit 166 will replace gates on the fanin-side of a cut at cutpoint 140, such that gates within initial design (D) netlist 120 in the fanout-side of the cut at cutpoint 140 are not modified by parametric reduction toolkit 166 when performing the abstraction, and there is a 1:1 mapping between such gates in the fanout-side of the cut at cutpoint 140 within initial design (D) netlist 120 and abstracted design (D') 144. Note also that there is a unique mapping from gates on the cut at cutpoint 140 within initial design (D) netlist 120 and abstracted design (D') 144.

The abstraction performed by parametric reduction toolkit 166 to generate abstracted design (D') 144 results in a trace-equivalence between initial design (D) netlist 120 and abstracted design (D') 144. Trace equivalence between two designs requires that, first, for all possible traces (sequences of values to gates over time) over all gates of initial design (D) netlist 120 on the cut at cutpoint 140 and in the fanout-side of the cut at cutpoint 140 and, second, for all possible traces over the gates in gate set (C") 146 which are to replace cut gates (U) 132 and over the gates in the fanout-side of the cut at cutpoint 140 in abstracted design (D') 144, for every trace in the former, there exists an equivalent trace in the latter, and vice-versa. The sequences of values producible to a selected set of gates of initial design (D) netlist 120 is identical to the sequence of values producible to the corresponding gates in the abstracted design (D') 144.

Parametric reduction toolkit 166 is explicitly tuned for reducing the number of RANDOM gates in abstracted design (D') 144, and heuristically is able to eliminate other gates. As a result, parametric reduction toolkit 166 has the ability to exponentially improve the run-time of automated formal verification tools within verification environment 124 with respect to the state-of-the-art possible without this approach, and also provide benefits to other methods such as simulation, emulation, and other design reasoning/optimization paradigms.

Parametric reduction toolkit 166 provides selection unit 156 to choose candidate cut gates (U) 132 for abstraction, as well as replacement unit 158, for symbolically analyzing and synthesizing gate set (C") 146. When combined, selection unit 156 and replacement unit 158 prevent the exponential degradation of the performance of parametric reduction toolkit 166 as the size of the set of cut gates (U) 132 being replaced increases. Exponential degradation of the performance of explicit analysis, such as simulation-based analysis, is typical of the problems of the prior art. Gate set (C") 146 can be guaranteed to require at most 'N' RANDOM gates for a cut of 'N' gates. By selecting a set of cut gates (U) 132 with minimal size, parametric reduction toolkit 166 may achieve a maximal reduction in RANDOM gates.

Selection unit 156 is utilized for selecting the cut gates to attempt to abstract. Parametric reduction toolkit 166 reduces RANDOM gate count. Using replacement unit 158, discussed below, parametric reduction toolkit 166 replaces logic for a set of 'N' cut gates with a set of new RANDOM gates that will include at most 'N' new gates. Thus, parametric reduction toolkit 166 attempts to select as small of a set of gates to abstract as possible that constitutes a "cut" over as many RANDOM gates in original design (D) netlist 120 as possible.

The operation of selection unit 156 is more easily understood with respect to a set of requirements in the choice of a cut at a cutpoint 140 of original design (D) netlist 120. A cut at a cutpoint 140 of original design (D) netlist 120 is a partition of its gates into two sets: the fanin-side, and the fanout-side. Parametric reduction toolkit 166 computes a cut at a cutpoint 140 of original design (D) netlist 120, then replaces the fanin-side with a new and simpler piece of logic. This replacement is performed by reconnecting the cut gates (U) 132 which source edges which cross from the fanin side to the fanout side with source gates in the new logic. Parametric reduction toolkit 166 attempts to ensure that all invariants (N) 164, targets (T) 134 and constraints (B) 160 will be in the fanout-side of the cut at cutpoint 140, such that the original fanin-side of the cut at cutpoint 140 will be eliminated from the cone-of-influence of the problem (defined as all logic which fans out to the invariants (N) 164, targets (T) 134 and constraints (B) 160) when parametric reduction toolkit 166 reconnects to the new logic.

Selection unit 156 additionally attempts to find a cut at cutpoint 140 which has as few cut gates (U) 132 as possible, because the gate set (C") 146 created in replacement unit 158 requires one RANDOM gate per cut gate (U) 132. Selection unit 156 selects cutpoints 140 using min-cut analysis in several steps. First, selection unit 156 labels each invariant (N) 164, target (T) 134 and constraint (B) 160 gate of original design (D) netlist 120 as a "sink". Selection unit 156 then labels every next-state and initial-value gate as a sink. The failure to label every next-state and initial-value gate as a sink might prevent selection unit 156 from obtaining a cut at a cutpoint 140 of the graph whose fanin-side will fall out of the cone of influence when replaced (due to the mapping of registers to initial-value and next-state function gates). Additionally selection unit 156 labels every next-state and initial-value gate as a sink, because replacement unit 158 does not explicitly seek to re-encode the sequential behavior of the design.

Selection unit 156 then labels every RANDOM gate as a source. Finally, selection unit 156 utilizes min-cut analysis between the labeled sources and sinks to find a minimal set of cut nodes at cutpoint 140. Selection unit 156 seeks a cut at a cutpoint 140 which has minimal size with respect to the number of gates sourcing crossing edges of the cut. Note that the min-cut analysis of selection unit 156 is combinational in the sense that it does not traverse "through" next-state functions or initial-value functions of registers. The combinational operation of selection unit 156 is well-suited to the process of maximizing RANDOM gate reduction potential. In the case that multiple min-cuts of identical width exist, parametric reduction toolkit 166 may attempt to abstract any or all of them to find the solution with greatest reduction potential.

As will be discussed with respect to replacement unit 158, parametric reduction toolkit 166 relies upon the ability to identify all possible values producible on cut gates (U) 132 as a function of any registers that may appear in the cone of influence of the cut gates (U) 132, then re-encoding the fanin-side of the cut at cutpoint 140 using a new set of RANDOM gates. The min-cut result as seeded is ideally suited in this application since it will compute the smallest available cut of cut gates (U) 132, including the most original RANDOM gates. As an example, consider a set of seven selected cut gates which originally has 20 RANDOM gates in its fanin-side. After replacing the fanin-side of the cut with the gate set (C") 146, replacement unit 158 can produce a gate set (C") 146 with only seven new RANDOM gates.

Note, however, that the methods used by selection unit 156 to analyze and by replacement unit 158 to replace the set of cut gates (U) 132 may be computationally expensive, and it may be the case that replacement unit 158 cannot succeed in processing the set of cut gates (U) 132 chosen by selection unit 156. Parametric reduction toolkit 166 solves this problem incrementally, by performing the analysis and replacement in a levelized fashion. Parametric reduction toolkit 166 defines the level of gates such that all constant gates, RANDOM gates, and registers have level 0; the level of other combinational gates is equal to the maximum level of any of their sourcing gates plus one. Parametric reduction toolkit 166 iterates between level 1 and the maximum level of any of the chosen "ideal" cut gates (U) 132 at cutpoints 140, solving a min-cut problem involving all gates of the given level and the RANDOM gates in their cone of influence. At each stage, the parametric reduction toolkit 166 analyzes and abstracts the smaller, partial cone of logic.

One benefit of the incremental solution described above is that earlier stages of abstraction by selection unit 156 and replacement unit 158 simplify the logic to be analyzed and abstracted in later stages, with the result that earlier stages reduce the resources needed by the later stages. This reduces overall peak resource requirements, and increases the chances that the desired cut may be successfully abstracted in an incremental fashion even if this abstraction is computationally infeasible without incremental processing. Further, even if the process employed by selection unit 156 and replacement unit 158 ultimately fails to abstract the desired cut gates (U) 132 due to resource limitations, it is likely that a fair amount of simplification can still be successfully performed on earlier stages. If applied using a transformation-based verification toolset, which may be included in verification environment 124, further transformations are possible between each incremental abstraction, which may further simplify abstracted design (D') 144 to enable greater reductions.

Parametric reduction toolkit 166 first process the gates at a hypothetical first level, abstracting the gates at that level with simpler logic. Parametric reduction toolkit 166 then processes the gates at a hypothetical second level; this processing includes the simplified, replaced logic for at the hypothetical first level obtained during the prior step. Parametric reduction toolkit 166 then process the gates at a hypothetical third level, and so on; eventually, processing the logic with the highest-level of any gate in the originally selected min-cut. Parametric reduction toolkit 166 may perform all necessary reductions in a single step, though the reduction may be more computationally efficient in the incremental manner as discussed. Alternative embodiments of this method are possible, such as starting/stopping at a level other than the minimum and the maximum level of any gate in the originally selected min-cut. Incrementing by M levels rather than by 1 is also possible. The latter alternative embodiment may prove useful in cases in which the number of levels is very large, to reduce the number of distinct abstraction steps.

Replacement unit 158 analyzes the cut at cutpoint 140, and creates gate set (C") 146. Replacement unit 158 creates gate set (C") 146 so that each original cut gate (U) 132 will be replaced by one gate in gate set (C") 146. In order to facilitate this one-to-one mapping, replacement unit 158 adheres to the requirement that the set of values which may be produced by the gate set (C") 146 must be identical to set of values which may be produced by the original cut gates (U) 132 on a per-state basis. For every state (valuation to registers) of original design (D) netlist 120, the replacement unit 158 enumerates the subset of the $2^N$ (for N cut gates, where symbol ^ denotes exponentiation) possible values which may be produced at those cut gates (U) 132 under some valuation to the original RANDOM gates. The subset of $2^N$ possible values to the replacement gate set (C") 146 for cut gates (U) 132 (under some valuation to the new RANDOM gates) must equal that of the original cut gates (U) 132, on a per-state basis. Note that replacement unit 158 uses the same set of registers in both the original design (D) netlist 120 and abstracted design (D') 144, ensuring that the replacement with gate set (C") 146 preserves property checking (i.e., replacement with gate set (C") 146 will not render incorrect 'pass' nor 'fail' results) when the target (T) 134 constraint (B) 160 and invariant gates (N) 164 are in the fanout-side of the logic being replaced.

Replacement unit 158 utilizes binary decision builder 126 and binary decision diagrams 170 to avoid bottlenecks in the enumeration process described above (e.g., analyzing $2^N$ values one-at-a-time in a netlist becomes infeasible as N grows beyond 30). The operation of replacement unit 158 in enumerating the producible values at cut gates (U) 132 is discussed below. In the discussion below, $C\_i$ represents the i'th cut gate. Replacement unit 158 declares a distinct binary decision diagram 170 variable for each cut gate (U) 132 (hereafter called $G\_i$) at cutpoints 140; for each RANDOM gate in the fanin-side of the cut at cutpoint 140; and for each register in the fanin-side of the cut at cutpoint 140. Replacement unit 158 builds a binary decision diagram 170 for the function of each cut gate (U) 132 (hereafter called $F\_i$) supported by the binary decision diagrams 170 variables for the RANDOM gates and registers. Replacement unit 158 next builds binary decision diagrams 170 for the expression ($G\_i == F\_i$), conjuncts this expression over all i's, and then existentially quantifies the RANDOM gate variables from the conjunction. The resulting binary decision diagrams 170 comprise all possible valuations to the cut gates (U) 132 (represented by the $G\_i$'s) as a function of the registers (represented by their corresponding binary decision diagram 170 variables).

Figure 3:
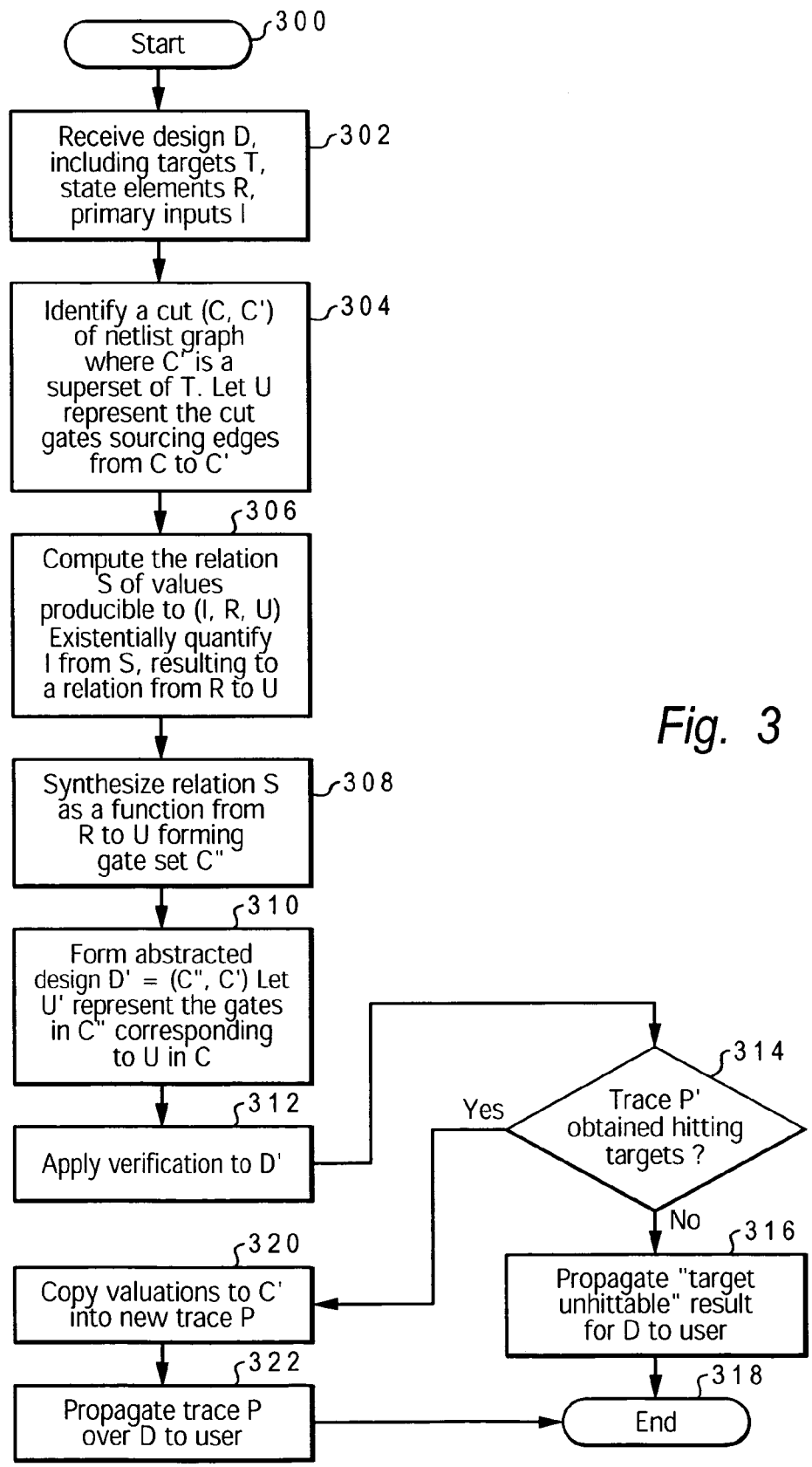
FIG. 3 is a high-level logical flowchart of a process for performing parametric reduction of sequential designs in accordance with a preferred embodiment of the present invention.

With reference now to FIG. 3, a high-level logical flowchart of a process for performing parametric reduction of sequential designs in accordance with a preferred embodiment of the present invention is illustrated. The process starts at step 300 and then proceeds to step 302, which depicts verification environment 124 receiving initial design (D) netlist 120, including targets (T) 134, state elements (R) 136 and primary inputs (I) 138. The process next moves to step 304. At step 304, selection unit 156 identifies cut points 140 for a cut (C, C') of initial design (D) netlist 120 where (C') is a superset of targets (T) 134, letting cut gates (U) 132 represent the cut gates sourcing edges from (C) to (C').

The process then proceeds to step 306, which depicts replacement unit 158 computing the relation (S) 142 of values producible to (I, R, U), then existentially quantifying primary inputs (I) 138 from relation (S) 142, resulting in a relation (S) 142 from state elements (R) 136 to cut gates (U) 132. The process then moves to step 308. At step 308, replacement unit 158 synthesizes relation (S) 142 as a function from state elements (R) 136 to cut gates (U) 132; forming gate set (C") 146. The process proceeds to step 310 which depicts replacement unit 158 forming abstracted design (D') 144 equal to (C", C'). Corresponding gates (U') 148 represent the gates in gate set (C") 146 corresponding to cut gates (U) 132 in constraints (B) 160. The process then proceeds to step 312, which depicts verification environment 124 applying verification to abstracted design (D') 144.

Next, the process moves to step 314. At step 314, verification environment 124 determines whether a trace (P') 152 hitting targets (T) 134 has been obtained. If verification environment 124 determines that no trace was obtained hitting a target, then the process next moves to step 316, which depicts verification environment 124 propagating target unhittable results to initial design (D) netlist 120 and reporting results to output table 122. The process then ends at step 318.

If verification environment 124 determines that abstracted trace (P') 152 is obtained hitting a target (T) 134, then the process next moves to step 320. At step 320, verification environment 124 copies valuations from set (C') 176 into new trace (p) 178. The process then proceeds to step 322, which depicts verification environment 124 propagating new trace (p) 178 over initial design (D) netlist 120 to the user and reporting results to output table 122. The process then ends at step 318.

Given a binary decision diagram 170 representing all possible valuations to the cut gates (U) 132 (represented as binary decision diagram 170 variables G_i) as a function of registers (represented as binary decision diagram 170 variables R_j), correlating to set S of 304, replacement unit 158 creates the replacement cone in several steps. Note that gate set (C") 146 will be a combinational function over a new RANDOM gate for each of the G_i variables, and over the original registers R_j. Additionally, the original RANDOM gates do not appear in the gate set (C") 146 (unless they are to be preserved). Gate set (C") 146 includes a gate C'_i used to replace each C_i, such that C'_i drives the same behavior as C_i as a function of R_j, constructed using the method embodied in the pseudocode for a Create_Replacement data structure below, which performs appropriately on binary decision diagrams 170 that include inverted edges.

As discussed below, binary decision diagrams 170 variables are referred to as "nonquantifiable" or "quantifiable". Binary decision diagrams 170 variables are created by BDD builder 126 either for cut gates (U) 132 (e.g., the G_i variables referred to above), or for RANDOM gates and registers. The variables for RANDOM gates are most often "quantifiable" (unless they are also G_i variables); the G_i variables and those for registers are most often "nonquantifiable". As will be discussed below, certain RANDOM gate variables (which may or may not be cut gates (U) 132 themselves) may in cases be deemed "nonquantifiable" if they are to be preserved. Hence, the present invention is discussed with respect to the quantifiable/nonquantiafiable terminology for generality.

With reference now to FIG. 5, a high-level logical flowchart of a process for performing optimal synthesis of binary decision diagrams with inverted edges and quantifiable as well as nonquantifiable variables in accordance with a preferred embodiment of the present invention is illustrated. This flowchart correlates to a description of the pseudocode for Create_Replacement to be provided below. The process starts at step 500 and then proceeds to step 502, which depicts replacement unit 158 receiving a binary decision diagram 170, hereafter referred to as B, over quantifiable binary decision diagram 170 variable Q and nonquantifiable BDD variables X, in addition to mapping n(X) between nonquantifiable variables and gates of initial design (D) netlist 120. The process then moves to step 504. At step 504, for each quantifiable variable q in Q, replacement unit 158 creates a RANDOM gate n(q). The process next proceeds to macro-step 506, which depicts replacement unit 158 establishing preliminary data structures for B and consists of steps 508-512.

At step 508, replacement unit 158 traverses each child node of B recursively from root to leaves, tracking whether an even or an odd number of inverted handles were encountered between the root and node b, and neglecting to traverse the children of the same node more than once. The process next moves to step 510, which illustrates, for each node b encountered, if through an even number of inverted handles, replacement unit 158 enqueueing that node in a Vars_To_Nodes(v) storage location. Similarly, for each node b encountered, if through an even number of inverted handles, replacement unit 158 enqueues the inverse of that node in a Vars_To_Nodes(v) storage location. The process then proceeds to step 512. At step 512, for each node b encountered, if the immediate parent of node b had a non-inverted handle, then replacement unit 158 sets variable p to that parent. Otherwise, replacement unit 158 sets p to the inverse of that parent. If node b was encountered through an even number of inverted handles, then replacement unit 158 enqueues p in Parents(v). Otherwise, replacement unit 158 enqueues p in Parents_Ivt(v).

The process next moves to macro-step 514, which depicts replacement unit 158 iterating over each binary decision diagram 170 variable in rank order of B (from root to leaf), through a series of steps labeled 516-554. At step 516, replacement unit 158 creates a for loop to iteratively repeat macro-step 518, discussed below, for each binary decision diagram 170 variable v in Q or X, in rank order of B. The process then proceeds to macro-step 518, which illustrates replacement unit 158 building a gate representation of the OR of all parent paths into node b, tracking inversions, and storing into path(b) or Path_Ivt(b) accordingly through a series of steps labeled 520-528 and steps 532-538. At step 520, replacement unit 158 creates a for loop to iteratively repeat steps 522-528 and steps 532-538, discussed below, for each binary decision diagram 170 node b in Vars_to_Nodes(v). The process next moves to step 522, which illustrates replacement unit 158 determining whether b is the root binary decision diagram 170 node. If b is the root binary decision diagram 170 node, then the process proceeds to step 524, which depicts replacement unit 158 setting variable g=GATE_ONE, after which the process continues to step 526, which is discussed below. If b is not the root binary decision diagram 170 node, then the process moves to step 534.

At step 534, replacement unit 158 determines whether b is inverted. If b is inverted, then the process proceeds to step 536, which illustrates replacement unit 158 setting g equal to a function 'OR(over all parent nodes b' In Parents_Ivt(b) of:(inverted(b')?Path(b'),Path_Ivt(b'0), AND (b is a BDD_THEN branch of b'? r(BDD_VARID(b')): INVERT (r(BDD_VARID (b'))'. The process then continues to step 526, which is discussed below. If b is not inverted, then the process proceeds to step 538, which illustrates replacement unit 158 setting g equal to a function 'OR(over all parent nodes b' In Parents (b) of:(inverted(b')?Path(b'),Path_Ivt (b'0), AND (b is a BDD_THEN branch of b'? r(BDD_VARID(b')): INVERT (r(BDD_VARID (b'))'. The process then continues to step 526.

At step 526, replacement unit 158 determines whether b is inverted. If b is inverted, then the process proceeds to step 528, which illustrates replacement unit 158 setting Path_Ivt (b)=g. The process then moves to step 530, which is described below. If b is not inverted, then the process proceeds to step 532, which illustrates replacement unit 158 setting Path(b)=g. The process then continues to step 530. At step 530, replacement unit 158 determines whether the variable v is quantifiable in Q. If the variable v is quantifiable in Q, then the process next moves to step 544, the first step of macro-step 542, which contains steps 544 to 554, and depicts replacement unit 158 creating a synthesized gate for variable v. At step 544, replacement unit 158 sets r(v)=n(v), and the process next proceeds—once iteration over all BDD variables v in macro-step 514 has completed—to step 556, which illustrates replacement unit 158 returning n(Q) as the synthesized gates for Q binary decision diagram 170 variables. The process then ends at step 556.

Returning to step 530, if the variable v is not quantifiable in Q, then the process next moves step 540 wherein it initializes Var_Must_Be__0(v) to ZERO, and Var_Must_Be__1(v) to ZERO. It then moves to step 546, which illustrates replacement unit 158 setting a for loop to iterate steps 548-554 over each binary decision diagram 170 node in Vars_To_Nodes(v). The process next proceeds to step 548. At step 548, replacement unit 158 determines whether b is inverted. If b is inverted, then the process next moves to step 550, replacement unit 158 sets g0=Path_Ivt(b) AND (mux-based-synthesis (BDD_EXIST (BDD_INVERT (BDD_THEN (b), Q)))) and sets g1=Path_Ivt(b) AND (mux-based-synthesis(BDD_EXIST (BDD_INVERT(BDD_ELSE(b), Q)))). The process then moves to step 552, which depicts replacement unit 158 setting Var_Must_Be__0(v)=Var_Must_Be__0(v) OR NOT(g0); and setting Var_Must_Be__1(v)=Var_Must_Be__1(v) OR NOT (g1); and setting r(v)=Var_Must_Be__1(v) OR (n(v) AND NOT (Var_Must_Be__0(v))). Once iteration over all BDD variables v in macro-step 514 has completed, the process then proceeds to step 556, which is described above.

Returning to step 548, if b is not inverted, then the process moves to step 554. At step 554, replacement unit 158 sets g0=Path (b) AND (mux-based-synthesis (BDD_EXIST (BDD_INVERT (BDD_THEN (b), Q)))) and sets g1=Path (b) AND (mux-based-synthesis(BDD_EXIST (BDD_INVERT(BDD_ELSE(b), Q)))). The process next returns to step 552, which is described above.

The following legend will be provide assistance in decoding the pseudocode for Create_Replacement below, which represents a preferred embodiment of replacement unit 158 and the method of the flowchart of FIG. 5:

C_i represents a cut gate (U) 132 from original design (D) netlist 120

G_i: binary decision diagram 170 variables for (quantifiable) cut gates (U) 132

R_j: binary decision diagram 170 variables for nonquantifiable variables (e.g., registers)

n (G_i): netlist RANDOM gate to be used in gate set (C") 146, correlating to binary decision diagram 170 variable G_i (i.e., to replace C_i)

n (R_j): netlist gate correlating to nonquantifiable binary decision diagram 170 variable R_j (e.g., a register)

r (G_i): replacement gate C'_i created for C_i (note that G_i uniquely correlates to a C_i)

r (R_j): netlist gate correlating nonquantifiable BDD variable R_j (e.g., a register gate)

BDD_TOP: the binary decision diagram 170 to be synthesized

BDD_ONE: represents the constant-one binary decision diagram 170

BDD_ZERO: represents the constant-zero binary decision diagram 170

GATE_ONE: represents a constant-one gate

GATE_ZERO: represents a constant-zero gate

BDD_THEN (node): gets the "then" child of binary decision diagram 170 node "node"

BDD_ELSE (node): gets the "else" child of binary decision diagram 170 node "node"

BDD_INVERT (node): inverts the binary decision diagram 170 node—flipping the "is inverted" flag BDD_IS_INVERTED (node): returns '1' exactly when the "is inverted" flag of the binary decision diagram 170 is set BDD_CLEAR_INVERTED (node): clears the "is inverted" flag of the binary decision diagram 170

BDD_VARID (node): returns the binary decision diagram 170 variable associated with "node" (which is undefined only for BDD_ZERO and BDD_ONE)

BDD_EXIST (node, Q): returns a binary decision diagram 170 representing "node" with variables in Q existentially quantified out OR (a,b): creates an OR gate whose inputs are gates a and b OR_QUEUE (q): creates an OR gate whose inputs are the gates in queue q AND (a,b): creates an AND gate whose inputs are gates a and b AND_QUEUE (q): creates an AND gate whose inputs are the gates in queue q NOT(a): creates an INVERTER gate whose input is gate a IF_THEN_ELSE (a,b,c): returns a gate encoding the function (OR (AND (a,b), AND (NOT (a), c)))

The pseudocode below represents a top-level function used to create a replacement gate for each G_i void in a preferred embodiment of replacement unit 158:

```
void Create_Replacement(BDD BDD_TOP) {
    for (each variable G_i)
        Create a RANDOM gate, called n(G_i);
    // Set up Parent and Var_To_Nodes lists:
    Create_Replacement1(BDD_TOP, BDD_ONE, 0);
```

```
-continued

// traverse both quantifiable and nonquantifiable vars
    for (each variable V_i in rank order of BDD_TOP)
       // follow order of variables from root to leaves
       Create_Replacement2(V_i);
    for (each variable G_i not in the support of BDD_TOP) {
       replace the corresponding cut gate C_i directly by n(G_i);
       r(G_i) = n(G_i);
    }
}
// this function lists the parent BDD nodes for each node plus its inversion
// in queue Parents( ) and Parents_Ivt( ) respectively, and lists the BDD nodes
// plus "inverted" handles for each variable inside of BDD_TOP in queue Vars_To_Nodes( )
// The parent of the root node (BDD_TOP) is uniquely labeled as BDD_ONE
void Create_Replacement1(BDD node, BDD parent, bool is_inverted) {
    if (node == BDD_ONE || node == BDD_ZERO)
       return;
    // Make sure node is positive and incorporate its phase in is_inverted:
    if (BDD_IS_INVERTED(node)) {
       is_inverted = !is_inverted;
       node = BDD_CLEAR_INVERTED(node);
       if (parent != BDD_ONE)
          parent = BDD_INVERT(parent);
    }
    if (is_inverted) {
       push(Parents_Ivt(node), parent);
       push_unique(Vars_To_Nodes(BDD_VARID(node)), BDD_INVERT(node)); // need not
push a given BDD handle twice onto Vars_To_Nodes
    }
    else {
       push(Parents(node), parent);
       push_unique(Vars_To_Nodes(BDD_VARID(node)), node);
    }
    if (!visited(node)) {
       visited(node) = TRUE;
       Create_Replacement1(BDD_THEN(node), node, is_inverted);
       Create_Replacement1(BDD_ELSE(node), node, is_inverted);
    }
}
// this function replaces each quantifiable C_i whose G_i is in the support
// of BDD_TOP with a trace-equivalent gate
void Create_Replacement2(BDD_VAR v) {
    for (each BDD node in Vars_To_Nodes(v))
       Create_Replacement3(node);
    if (v is a "quantifiable variable") {
       for (each BDD node in Vars_To_Nodes(v))
          Create_Replacement4(node);
       // The function to be created is
       // must_be_1 OR (n(v) AND NOT(OR(must_be_0,must_be_1)))
       // which simplifies to
       // must_be_1 OR (n(v) AND NOT(must_be_0))
       must_be_0 = OR_QUEUE(Var_Must_Be_0(v));
       must_be_1 = OR_QUEUE(Var_Must_Be_1(v));
       random = NOT(must_be_0);
       replacement_gate = OR(must_be_1, AND(n(v), random));
       replace the corresponding cut gate C_i by replacement_gate;
       r(G_i) = replacement_gate;
    }
}
// this function creates a gate representing the valuations to n(R_i) and
// n(G_i) variables which correlate to paths from the root BDD_TOP to the
// present BDD node/its inversion
void Create_Replacement3(BDD node) {
    assert(node != BDD_ONE && node != BDD_ZERO);
    is_inverted = BDD_IS_INVERTED(node);
    node = BDD_CLEAR_INVERTED(node);
    if (is_inverted)
       Path_Ivt(node) = Create_Path(node, is_inverted);
    else
       Path(node) = Create_Path(node, is_inverted);
}
// this is a "helper" function for Create_Replacement3. It produces a gate representing the
// valuations to gates correlating to BDD variables higher in the rank which "sensitize" the path
// from the root BDD_TOP to the present node
gate Create_Path(BDD node, bool is_inverted) {
    list = is_inverted ? Parents_Ivt(node) : Parents(node);
    final_gate = GATE_ZERO;
    // Note: root node has single BDD_ONE parent.
    for (each parent in list) {
       if (parent == BDD_ONE) {
```

-continued

```
      // this only happens for "root" node
      return GATE_ONE;
    }
    if (BDD_IS_INVERTED(parent)) {
      invert2 = !is_inverted;
      parent = BDD_CLEAR_INVERTED(parent);
      node2 = BDD_INVERT(node);
    }
    else {
      invert2 = is_inverted;
      node2 = node;
    }
    gate = invert2 ? Path_Ivt(parent) : Path(parent);
    // We use r(varid) vs. n(varid) to ensure that the synthesis is correct and
    // preserves the range of the cut. I.e., synthesized functions of lower vars may
    // otherwise not really correlate to values of synthesized functions of higher
    // vars, being "misled" by looking at the free parametric var valuations n(varid)
    // themselves instead of the synthesized functions r(varid) which reflect
    // conditions under which the r(varid) != n(varid)
    if (BDD_THEN(parent) == node2)
      gate = AND(gate, r(BDD_VARID(parent)));
    else // BDD_ELSE(parent) == node2
      gate = AND(gate, INVERT(r(BDD_VARID(parent))));
    final_gate = OR(final_gate, gate);
  }
  return final_gate;
}
// this function augments the gates representing paths from BDD_TOP to the
// current BDD node (or its inversion) recorded in Create_Replacement3, to
// reflect the impact of "nonquantifiable variables" below the node being considered
// in Create_Replacement3
void Create_Replacement4(BDD node) {
  is_inverted = BDD_IS_INVERTED(node);
  node = BDD_CLEAR_INVERTED(node);
  // Note: Q is the set of quantifiable variables:
  if (is_inverted) {
    gate = Path_Ivt(node);
    node2 = BDD_EXIST(BDD_INVERT(BDD_THEN(node)), Q);
  }
  else {
    gate = Path(node);
    node2 = BDD_EXIST(BDD_THEN(node), Q);
  }
  // The purpose of the following gate_then is to evaluate the conditions under
  // which the current BDD_VARID's synthesized function cannot evaluate to '1'.
  // Note: gate_then will be GATE_ZERO if the resut of BDD_EXIST is
  // BDD_ONE - i.e., the corresponding BDD_VARID is allowed to take the value '1'.
  // Otherwise, gate_then will represent a synthesis of the valuations to the prior
  // synthesized cut gate functions, and "deeper" non-quantifiable variables,
  // for which the corresponding cut-point may not evaluate to a '1' -
  // we thus push the result onto Var_Must_Be_0
  gate_then = AND(gate, Synthesize(node2));
  push(Var_Must_Be_0(BDD_VARID(node)), NOT(gate_then));
  if (is_inverted)
    node2 = BDD_EXIST(BDD_INVERT(BDD_ELSE(node)), Q);
  else
    node2 = BDD_EXIST(BDD_ELSE(node), Q);
  gate_else = AND(gate, Synthesize(node2));
  push(Var_Must_Be_1(BDD_VARID(node)), NOT(gate_else));
}
// this performs a common multiplexer-based synthesis of a BDD
// (without parameterization)
gate Synthesize(BDD node) {
  if (node == BDD_ZERO)
  return GATE_ZERO;
  if (node == BDD_ONE)
    return GATE_ONE;
  is_inverted = BDD_IS_INVERTED(node);
  node = BDD_CLEAR_INVERTED(node);
  // Check whether already synthesized:
  gate = Synthesized(node);
  if (!gate) {
    gate = IF_THEN_ELSE(r(BDD_VARID(node)), // "if" clause
      SYNTHESIZE(BDD_THEN(node)), // "then" clause
      SYNTHESIZE(BDD_ELSE(node))); // "else" clause
    // Remember the gate network that synthesizes this node:
    Synthesized(node) = gate;
```

```
    }
    // Correct result for inversion if necessary:
    return is_inverted ? NOT(gate) : gate;
}
```

The pseudocode for algorithm Create_Replacement_Alternative below represents an alternative top-level function used to create a replacement gate C'_i for each G_i. Though this pseudocode is sufficiently simpler than that of the prior example, it tends to be suboptimal in practice. The reason is the following. Each BDD_EXIST call will create a new BDD, which is directly synthesized as the replacement gate for the corresponding cut gate using algorithm Synthesize above. While this BDD, and hence the logic of the corresponding replacement gate, may be smaller for variables high in the rank of BDD_TOP than the corresponding replacement gate using the algorithm Create_Replacement, the corresponding BDD nodes and logic cannot be reused for the replacement gates of variables lower in the rank of BDD_TOP, overall increasing the cumulative size of the replacement logic.

```
void Create_Replacement_Alternative(BDD BDD_TOP) {
    for each quantifiable variable V_i
        n(V_i) = new RANDOM gate
    for (each variable G_i in rank order of BDD_TOP)
    // follow order of variables from root to leaves
    // quantify every lower-rank cut variable
        b_i = BDD_EXISTS(BDD_TOP, {G_{i+1}, . . . , G_N});
        // forced_0_i represents conditions for which the replacement gate of
        G_i must evaluate to 0
        forced_0_i = BDD_NOT( BDD_THEN( b_i ));
        // forced_1_i represents conditions for which the replacement gate of
        G_i must evaluate to 1
        forced_1_i = BDD_NOT( BDD_ELSE( b_i ));
        r(C_i) = OR( SYNTHESIZE( forced_1_i ),
        AND( n(C_i), NOT(SYNTHESIZE( forced_0_i)));
}
```

Translation unit 168 translates a counterexample trace, such as abstracted trace (P') 152 obtained over abstracted design (D') 144 to one consistent with the initial design (D) netlist 120, such as unabstracted trace (P) 154. A "trace", such as abstracted trace (P') 152 or unabstracted trace (P) 154 is a set of 0,1 logical evaluations to some of the gates of a design, such as abstracted design (D') 144 or initial design (D) netlist 120, respectively, over time. Traces generated by verification environment 124 may be incomplete; e.g., traces may not illustrate values for certain gates at certain points in time. If a consistent trace is generated by verification environment 124, it is assumed that, if verification environment 124 is performing random simulation in a manner which applies any trace values present for a RANDOM gate to drive the random simulation stimulus, and an arbitrarily selected constant is chosen for all other stimuli (for RANDOM gate values at time-steps which are not present in the trace), the value generated in random simulation by verification environment 124 for any gate in the design must match the value present in the trace (if it exists). Otherwise, the corresponding trace is considered inconsistent, not illustrating sufficient data to demonstrate how certain gates are taking their values. In discussing translation unit 168, the value in TRACE for gate G at time I is referred to as TRACE(G,I), which has values 0, 1, or U (where U means "unknown" or "not present").

Abstracted trace (P') 152 from the abstracted design (D') 144 includes some values for gates in the fanout-side of the cut, registers in the fanin-side of the cut at cutpoint 140, the cut gates (U) 132 themselves, and the gate set (C") 146. Abstracted trace (P') 152 will not include any values for the combinational/RANDOM gates on the original fanin-side of the cut at cutpoint 140, which are not included in abstracted design (D') 144. Translation unit 168 employs a 2-step process to translate abstracted trace (P') 152 and thereby generate unabstracted trace (P) 154, which is consistent with initial design (D) netlist 120.

Translation unit 168 obtains values for all cut gates (U) 132, and registers in the support of the gate set (C") 146, for all time-steps present in the trace. Note that some gates may be omitted from abstracted trace (P') 152, and some may have values missing for certain time-steps.

Figure 6:
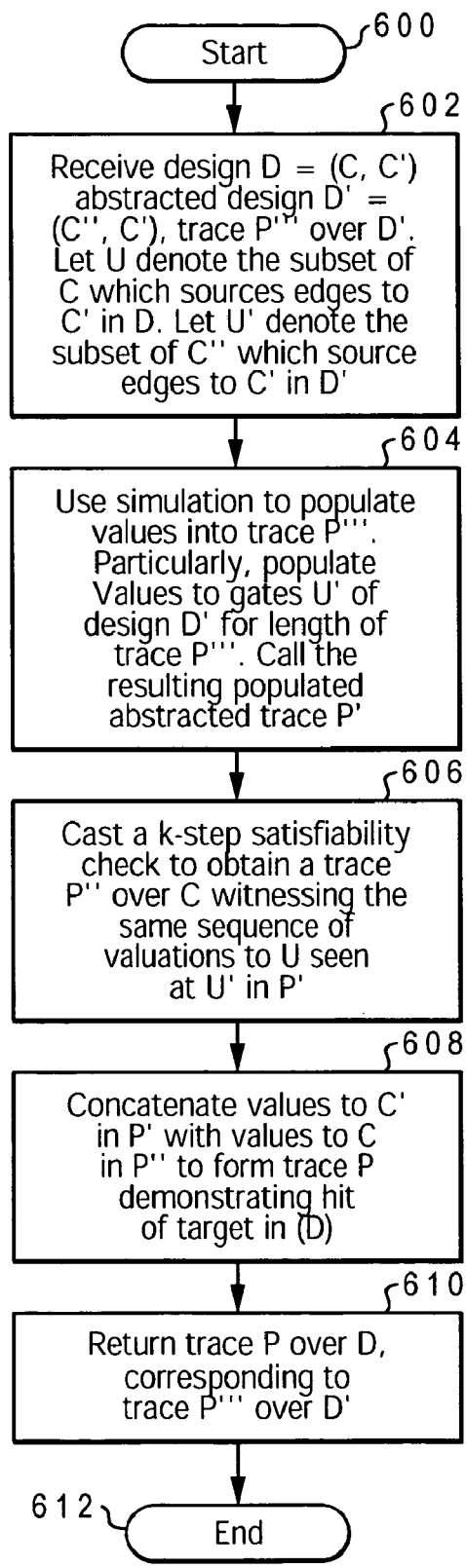
FIG. 6 is a high-level logical flowchart of a process for performing reversal of the effects of sequential reparameterization on traces in accordance with a preferred embodiment of the present invention.

Turning now to FIG. 6, a high-level logical flowchart of a process for performing reversal of the effects of sequential reparameterization on traces in accordance with a preferred embodiment of the present invention is depicted. The process starts at step 600 and moves to step 602, which depicts translation unit 168 receiving initial design (D) netlist 120, equal to (C, C'), abstracted design (D') 144, equal to (C",C'), trace p''' over abstracted design (D') 144, wherein cut gates U 132 represents the subset of C which sources edges to set C' 176 in initial design (D) netlist 120 and U' represents the subset of gate set C" 146 which source edges of set C' 176 in abstracted design (D') 144. Step 602 provides the step of receiving the original design, the abstracted design, and the first trace over the abstracted design wherein a set of cut gates denotes a subset of an identified gate set of the initial design which sources one or more edges to an initial gate set in the initial design and where a set of corresponding gates denotes a second gate set which sources one or more edges to the initial gate set in the abstracted design. The process then proceeds to step 604, wherein verification environment 124 uses simulation to populate trace p'''. Particularly, verification environment 124 uses simulation to populate values to corresponding gates (U') 148 for the necessary length of trace p''', generating a resulting populated abstracted trace p' 152. The process then moves to step 606.

At step 606, translation unit 168, casts a k-step satisfiability check to obtain a trace (P'') 150 over (C), witnessing the same sequence evaluations to cut gates (U) 132, seen at corresponding gates (U') 148 in abstracted trace (P') 152. The process next proceeds to step 608, which illustrates translation unit 168 concatenating values to (C) from trace (P'') with values to (C') in abstracted trace (P') 152 to form unabstracted trace (P) 154, demonstrating a hit of the target in initial design (D) netlist 120. The process then moves to step 610. At step 610, translation unit 168 returns new trace (p) 178 over initial design (D) netlist 120, corresponding to trace p''' over abstracted design (D') 144. Finally, the process ends at step 612.

In a preferred embodiment of the flowchart of FIG. 6, translation unit 168 performs using simple recursive simulation, over the gate set (C") 146, using a method described in pseudocode below:

```
for each timestep i in 0 .. length(TRACE)-1 {
   for each cut gate G_i {
      if( TRACE (G_i,i) = = U ) {
         TRACE(G_i, i) = Simulate(G_i, i);
      }
   }
}
sim_value Simulate(gate g, unsigned i) {
   if (g has been 'replaced" by another gate h) {return Simulate(h,i);}
   if( TRACE(g,i) != U ) {return TRACE(g,i);}
   if( g is a register) {
      if(i==0)   {val = Simulate(INIT_VALUE (g), 0);}
      else       {val = Simulate(NEXT_STATE(g), i-1);}
   }
   else if(g is a RANDOM gate) {
      val = randomly choose a 0,1 value;
   }
   else { // g is a combinational gate with function F
      val = F( return value of Simulate( ) applied to each input gate to g,
      for time i);
   }
   TRACE(g,i) = val;
   return val;
}
```

Translation unit 168 next performs a satisfiability-check over the original logic (from initial design (D) netlist 120) driving the cut gates (U) 132, to compute values to the RANDOM gates in the original fanin-side of the cut at cutpoint 140 which will produce the same sequence of values from unabstracted trace (P) 154 at cut gates (U) 132, as a function of the register values in that cut at cutpoint 140. By construction, since abstraction to create abstracted trace (P') 152 preserves semantics (even under constraints (B) 160, as discussed below), such a sequence does exist in initial design (D) netlist 120. The pseudocode below represents a function used by translation unit 168 to obtain a satisfiability check:

```
void Translate_Trace( ) {
   gate to satisfiability_check = GATE_ONE;
   for each timestep j in 0. .length(TRACE)-1 {
      for each cut gate G_i {
         ASSERT(TRACE(G_i, j) ! = U);
         // note - the prior pseudocode ensured that these will each be defined
         if ( TRACE (G_i, j) = = 1 ) {
            gate = Get_Cone (G_i, j);
         }
         else
            gate = NOT(Get_Cone (G_i, j));
         }
         gate_to_satisfiability_check = AND (gate, gate_to_satisfiability_check)
      }
      // need an extra pass over all constraint (B) 160 gates which were not synthesized, in case
their cones did not overlap that of the targets.
      // In that case, their semantic impact on RANDOM gate stimulus may not be reflected in
TRACE;
      // disjoint cones separately to ensure that the resulting trace satisfies those constraints
anyway to ensure overall semantic preservation of constraints.
         for each constraint gate G_i which was not synthesized
            gate_to_satisfiability check = AND (Get_Cone (G_i, j), gate_to_satisfiability_check)
   }
   produce a trace TRACE2 showing how to evaluate gate_to_satisfiability_check to a logical '1'.
   use Append_Traces( ) to produce a consistent trace for the original design, completing the trace
translation procedure
}
// this function performs a combinational unfolding of the design to enable a satisfiability-check
// to produce a trace showing how the original fanin-side of the cut can produce the same
// sequence of values seen in TRACE to the cut gates in the abstract design, which is consistent
// with the values to the registers in the gate set (C") 146
gate Get_Cone (gate g, unsigned i) {
   if( MAPPING(g,i) ) {return MAPPING(g,i);} // already created the corresponding unfolded
gate
   if( TRACE(g,i) == 0 ) {return GATE_ZERO;}
   if( TRACE(g,i) == 1 ) {return GATE_ONE;}
   if( g is a register) {
      if(i==0) {val = Get_Cone(INIT_VALUE(g), 0);}
      else {val = Get_Cone(NEXT_STATE(g), i-1);}
   }
   else if(g is a R2NDOM gate) {
      val = Create RANDOM GateQ; // this creates a new RANDOM gate
   }
   else { // g is a combinational gate of type F
      // here, Create_Gate_F creates a gate of the same type as F, connecting the i-th input to this
      // gate to the result of calling Get_Cone on the ith-input gate to g, at time i
      val = Create_Gate_F( return value of Get_Cone applied to each input gate to g, for time i);
   }
   MAPPING(g,i) = val;
```

```
    return val;
  }
}
Append_Traces( ) {
  for each timestep i in 0. .length(TRACE)-1 {
    for each gate g in the replacement cone {
      if(TRACE(g,i) == U) {
        TRACE(g,i) = TRACE2( MAPPING(g,i), 0 );
      }
    }
  }
}
```

Translation unit 168 uses satisfiability checking over an unfolded instance of the sequential problem embodied in abstracted trace (P') 152 to generate a preliminary trace showing values to the original fanin-side of the cut at cutpoint 140 which drive the same sequence of values seen in the simulated, abstracted trace (P') 152. Translation unit 168 then "re-folds" that preliminary trace and append it into TRACE, resulting in an unabstracted trace (P) 154 demonstrating how initial design (D) netlist 120 drives the same sequence of values present in abstracted trace (P') 152 to the cut gates (U) 132 and in turn, to all gates in the fanout-side of the cut at cutpoint 140. It is noteworthy that the trace translation method applied by translation unit 168 is applicable whether the overall abstraction process of parametric reduction toolkit 166 processed the cut gates (U) 132 in one step, or incrementally through many steps.

The design of translation unit 168 includes a noteworthy subtlety. A register in the original fanin-side of the cut at cutpoint 140 may fall out of the cone in the gate set (C") 146. For example, say a cut gate (U) 132 g_i is defined as i_i XOR r_i, where i_i is a RANDOM gate and r_i is a register (XOR denotes the exclusive-or function). Abstraction by parametric reduction toolkit 166 may replace this cut gate (U) 132 g_i with a new RANDOM gate if, in initial design (D) netlist 120, there exists some sequence of values to i_i which will allow the cut gate to drive any possible sequence of 0,1 values, regardless of the values to r_i. The first step of trace translation by translation unit 168 will not assign values to r_i in its simulation, because gate set (C") 146 does not include r_i. However, the second step of trace translation by translation unit 168 will require the sequence of values r_i takes to enable translation unit 168 to choose values for i_i which drive the sequence of values seen at the replaced cut gate (U) 132 in abstracted design (D') 144. The Get-Cone pseudocode above solves this problem, by unfolding "through" such registers with unassigned values in TRACE, to enable the satisfiability check to compute the values of such registers.

Exploitation unit 172 enhances the reduction potential of the parametric reduction toolkit 166 by exploiting invariants (N) 164 and constraints (B) 160 present in initial design (D) netlist 120. The semantics of invariants (N) 164 and constraints (B) 160 were described above. A constraint (B) 160 gate is one which must always evaluate to a logical '1' in the verification process. Constraints (B) 160 represent valuations to RANDOM gates and/or registers which are to be "artificially" disallowed by the verification environment 124.

Without the constraint (B) 160, verification environment 124 might unnecessarily explore such valuations. Exploitation unit 172 uses the presence of constraints (B) 160 to simplify gate set (C") 146, and if possible, to eliminate the need for an "artificial constraint" by synthesizing the constraint (B) 160. For example, if a constraint (B) 160 evaluates to a '1' exactly when a vector of RANDOM gates evaluates to even parity, exploitation unit 172 can eliminate the need for a constraint (B) 160 to enforce such a condition by creating a portion of gate set (C") 146 for any one of those RANDOM gates which is not RANDOM, but instead deterministically drives a '1' exactly when the other RANDOM gates in the vector have odd parity (to overall ensure that sink logic of the original gates see a vector which is guaranteed to adhere to even parity, even without the constraint). However, in other cases, the constraint (B) 160 cannot be so synthesized.

For example, assume the constraint (B) 160 is of the form: "a given set of registers has even parity AND a given set of RANDOM gates has odd parity". Exploitation unit 172 simplifies this constraint (B) 160 by synthesizing the latter part, to ensure that the RANDOM gates, when replaced, drive odd parity. Exploitation unit 172 then simplifies the constraint (B) 160 to "a given set of registers has even parity." Because replacement unit 158 does not re-encode registers themselves (doing so would risk moving the complexity class of this problem from NP to PSPACE), exploitation unit 172 cannot synthesize away such a constraint (B) 160 outright, but can indeed work to synthesize aspects of such a constraint (B) 160 to simplify gate set (C") 146, and retain only a simplified constraint (B) 160 thereafter.

Exploitation unit 172 performs simplification of the gate set (C") 146 and constraints (B) 160 in several steps. Recall that selection unit 156 labels sinks of a min-cut process to include constraints (B) 160, thereby ensuring that constraints (B) 160 will be in the fanout-side of cut at cutpoint 140, or on the cut at cutpoint 140 itself. Those constraints (B) 160 that are not combinationally driven by RANDOM gates cannot be readily simplified by selection unit 156 and replacement unit 158. Those constraints (B) 160 that are not combinationally driven by RANDOM gates are ignored by replacement unit 158 in the abstraction process and semantically preserved (inasmuch as all gates in the fanout side of the cut at cutpoint 140 are semantically preserved). Those constraints (B) 160 that are combinationally driven by RANDOM gates are candidates for simplification (regardless of whether they are also driven by registers). Alternative embodiments may add such RANDOM-driven constraints (B) 160 gates to the cut at cutpoint 140 to abstract, even if they are not chosen as being on the min-cut at cutpoint 140, to enable further simplifications.

If a constraint (B) 160 gate is on the cut at cutpoint 140, when analyzing the language of the cut at cutpoint 140 to form BDD_TOP to pass to gate set (C") 146 creation code in replacement unit 158, BDD_TOP is conjuncted to the binary decision diagrams 170 representing the function of the constraint gate F_i over register variables R_i, and original RANDOM gate variables (with a small subtlety, discussed below), forcing conjunction of (F_i=1) onto BDD_TOP. For other non-constraint gates, replacement unit 158 conjuncts in (F_i==G_i), allowing F_i to evaluate to either a 0 or a 1 as consistent with initial design (D) netlist 120. The conjunctive behavior above effectively restricts BDD_TOP (representing those valuations to C_i that are sensitizable as a function of R_i) to eliminate any valuations for which the constraint (B) 160 gate does not evaluate to '1'. Synthesis methods used by replacement unit 158 thereafter create gate set (C") 146, which has been simplified by the constraint (B) 160. If the resulting constraint (B) 160 is a cut gate (U) 132, now driven by gate set (C") 146, the resulting constraint (B) 160 will evaluate to a constant '1' in abstracted design (D') 144, because the resulting constraint (B) 160 will be replaced by GATE_ONE. Therefore the resulting constraint (B) 160 may trivially be removed as a constraint (B) 160 because it has no artificial "constraining power".

Some constraints (B) 160 have a sequential nature which cannot be synthesized away by replacement unit 158 with the method discussed above, and exploitation unit 172 ensures that such constraints (B) 160 are preserved, rather than allowing them to be discarded by abstraction, and risking a violation of the semantics of the verification problem with abstracted design (D') 144. Exploitation unit 172 handles such constraints (B) 160, for any constraint (B) 160 gate which is also a cut gate (U) 132, in several steps. First exploitation unit 172 build F_i for a constraint (B) 160 function over registers and RANDOM gates (with respect to the original design). Then, exploitation unit 172 existentially quantifies away all RANDOM gate variables from F_i. If the resulting quantified F_i is BDD_ONE, then no special treatment is necessary, because, for all valuations to the registers, there is a legal set of inputs, and the gate set (C") 146 will properly reflect exactly that set of inputs. Otherwise, exploitation unit 172 replaces the constraint (B) 160 with a simplified constraint to disallow some valuations to registers. The original constraint (B) 160 gate itself will be driven by GATE_ONE and will be discarded. Exploitation unit 172 adds a new constraint (B) 160 to original design (D) netlist 120, which is a direct synthesis of this quantified F_i (created using method Synthesize, which is described above).

Exploitation unit 172 further provides means for addressing a subtlety to constraint (B) 160 handling that may require special treatment. As discussed above, parametric reduction toolkit 166 conjuncts BDD_TOP to the binary decision diagram 170 (hereafter called B_i) representing the function of the constraint gate F_i, which is a function of register variables and RANDOM gate variables. This conjunction in turn will force the gate set (C") 146 created for the corresponding cut to adhere to evaluating any constraints on the cut to be '1'. Forcing the gate set (C") 146 created for the corresponding cut to adhere to evaluating any constraints on the cut to be '1' may be excessively aggressive if the B_i includes "dead-end states" (i.e, valuations to registers for which no legal input stimulus is possible).

In the example above, given a constraint (B) 160 such as "a given set of registers has even parity AND a given set of RANDOM gates has odd parity", the dead-end constraint (B) 160 contained therein is that "a given set of registers has even parity". With such constraints (B) 160, exploitation unit 172 will include only the RANDOM-gate-constraining portion of the constraint (B) 160 (e.g., "a given set of RANDOM gates has odd parity") to conjunct to BDD_TOP, and parametric reduction toolkit 166 will factor out the dead-end constraint portion before exploitation unit 172 conjuncts to BDD_TOP.

Exploitation unit 172 executes the behavior described above when conjuncting the dead-end states to BDD_TOP. Exploitation unit 172 will force the function of every replacement gate to include the dead-end states in its support, which may, for example, turn a combinationally-driven original cut gate (U) 132 into a sequentially-driven replacement gate. While this transformation does not necessarily violate the semantics of the verification problem contained in original design (D) netlist 120, the transformation may be particularly undesirable if, for example, sequential logic is introduced onto an initial-value cone. In such a case, verification environment 124 may encounter cyclic definitions when evaluating the initial states of the design, (e.g., the initial value of registers R_1 and R_2 may both become ((R_1 AND R_2) OR (NOT R_1 AND NOT R_2)), whereas they originally were GATE_ONE). Exploitation unit 172 handles this condition by first building the binary decision diagram 170 B_i for the constraint (B) 160, then extracting the dead-end constraints (B) 160 from B_i by setting the function B'_i=BDD_EXIST(B_i, RANDOM gate variables).

If the resulting B'_i is not BDD_ONE, then B'_i contains a list of all dead-end states. Exploitation unit 172 next forms B"_i in a series of steps:

---

B"_i = BDD_ZERO.
For each cube of B'_i // a "cube" is a set of min-terms contained in B'_i such that every binary decision diagrams 170 variable in the support of the cube evaluates to a single value
B"_i=BDD_OR(B"_i, BDD_COFACTOR (B_i, cube)).
//BDD_COFACTOR effectively performs BDD_AND over B_i and cube, then performs BDD_EXIST over variables in the support of cude on the result
Exploitation unit 172 finally conjuncts the resulting B"_i onto BDD_TOP, instead of conjuncting B_i onto BDD_TOP.

---

An invariant (N) 164 gate is similar to a constraint (B) 160 gate in that it will always be evaluated to a logical '1' by the verification environment 124. Unlike constraints (B) 160, which are generally "artificial" in the sense that verification environment 124 may evaluate that gate to a logical '0' if not labeled as a constraint (B) 160, an invariant (N) 164 gate will always evaluate to a '1' by the structure of the problem, even if not labeled as an invariant (N) 164. This difference allows a greater degree of flexibility and reduction potential, thus invariants (N) 164 may be treated differently from constraints (B) 160.

Exploitation unit 172 first treats invariant (N) 164 gates in a manner similar to constraint (B) 160 gates for obtaining the set of cut gates (U) 132. Exploitation unit 172 labels invariant (N) 164 gates as sinks, placing them on the fanout-side of the cut at cutpoints 140 (or on the cut at cutpoints 140). Exploitation unit 172 may add any invariant (N) 164 gates which are combinationally driven by RANDOM gates as cut gates (U) 132, without regard to whether the min-cut solution includes them. However, instead of conjuncting to BDD_TOP the binary decision diagrams 170 representing the function of the invariant (N) 164 gate, exploitation unit 172 uses the inverse of the binary decision diagram 170 for the invariant (N) 164 gate as a "don't care" against which exploitation unit 172 may simplify BDD_TOP. Because any valuation in the inverse of the invariant (N) 164 binary decision diagrams 170 cannot be evaluated by the verification environment 124, the exploitation unit 172 may freely add or remove any such valuation from BDD_TOP. Note that the dead-end states B'_i of constraints as discussed above may also be used as "don't cares" because re-application of B"_i as a constraint will disallow such conditions from being evaluated during verification of the abstracted design.

To additionally preserve the set of invariant (N) 164 valuations to registers that will never occur (for later methods to exploit), exploitation unit 172 synthesizes invariant (N) 164 binary decision diagrams 170 using the procedure given for the constraint (B) 160 binary decision diagrams 170 above. Note that with constraints (B) 160, exploitation unit 172 translates simplified constraints (B) 160 rather than risk violating verification semantics through the abstraction. In contrast, invariants (N) 164 are "redundant". Their synthesis is optional, and their inclusion can be selected by size of the replacement cone or any variety of other metrics.

Figure 4:
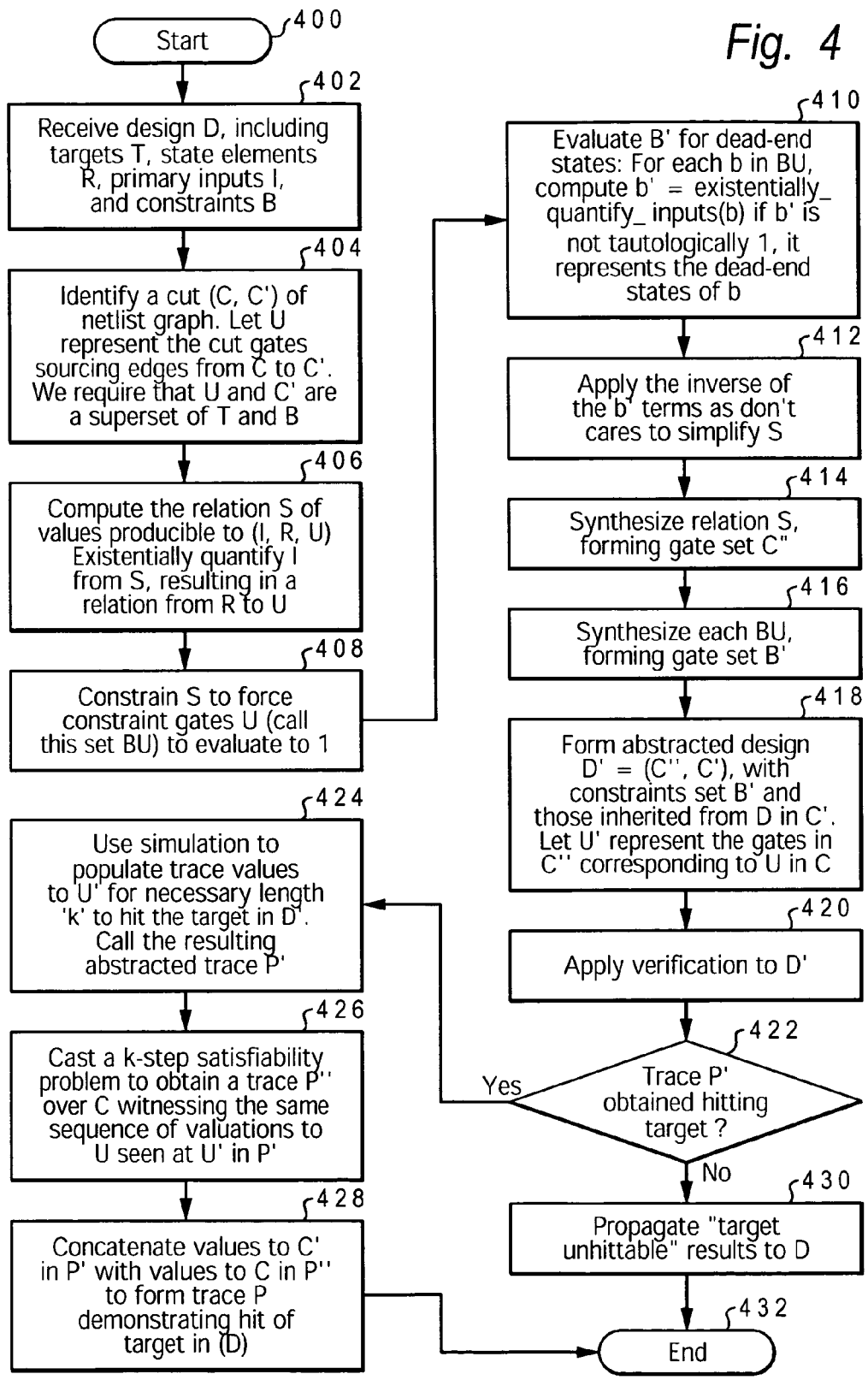
FIG. 4 is a high-level logical flowchart of a process for preservation of constraints during sequential reparameterization in accordance with a preferred embodiment of the present invention.
Figure 5B:
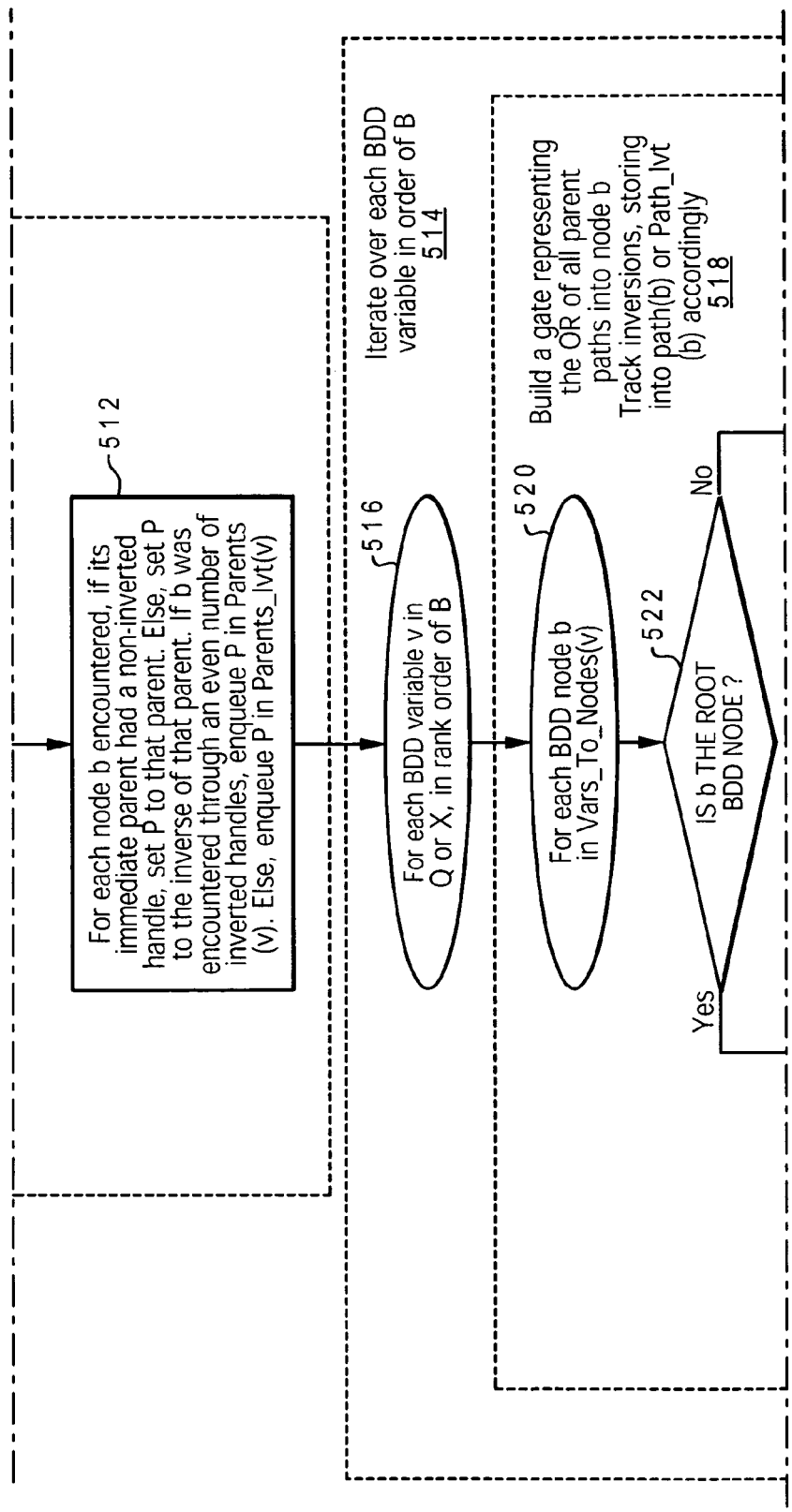
FIG. 5 is a high-level logical flowchart of a process for performing optimal synthesis of binary decision diagrams with inverted edges and quantifiable as well as nonquantifiable variables in accordance with a preferred embodiment of the present invention.
Figure 5C:
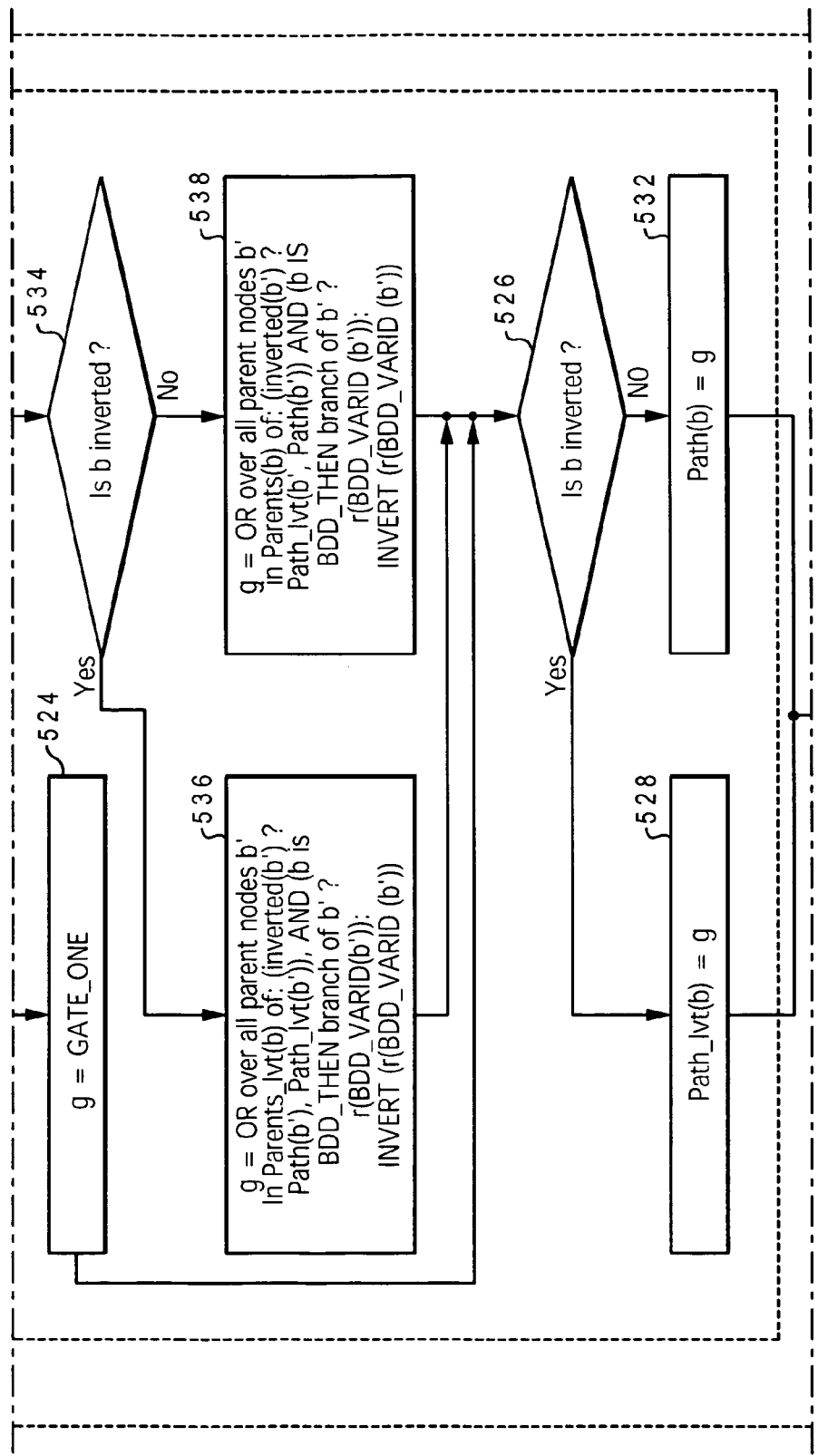
Figure 5D:
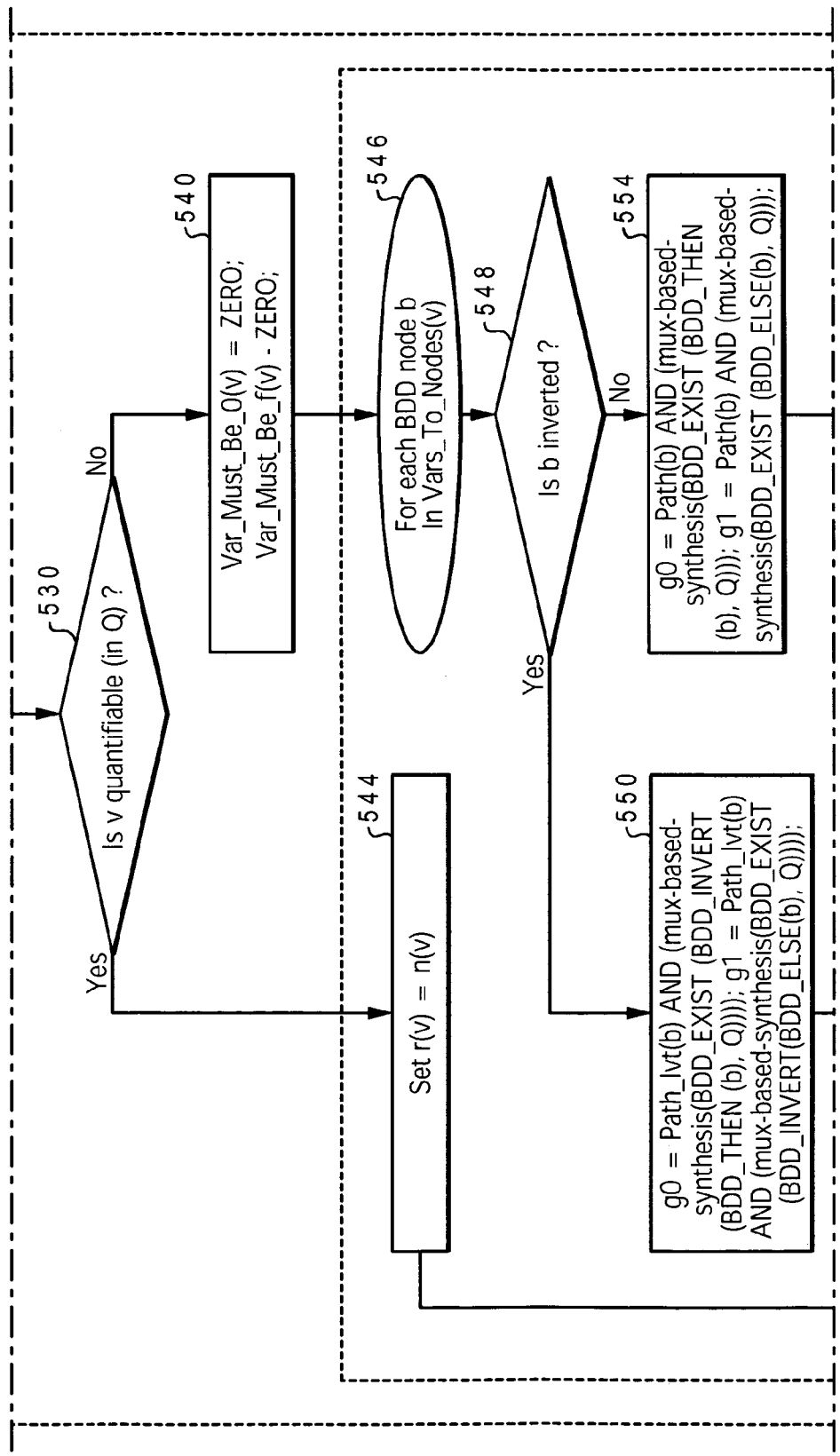
Figure 5E:
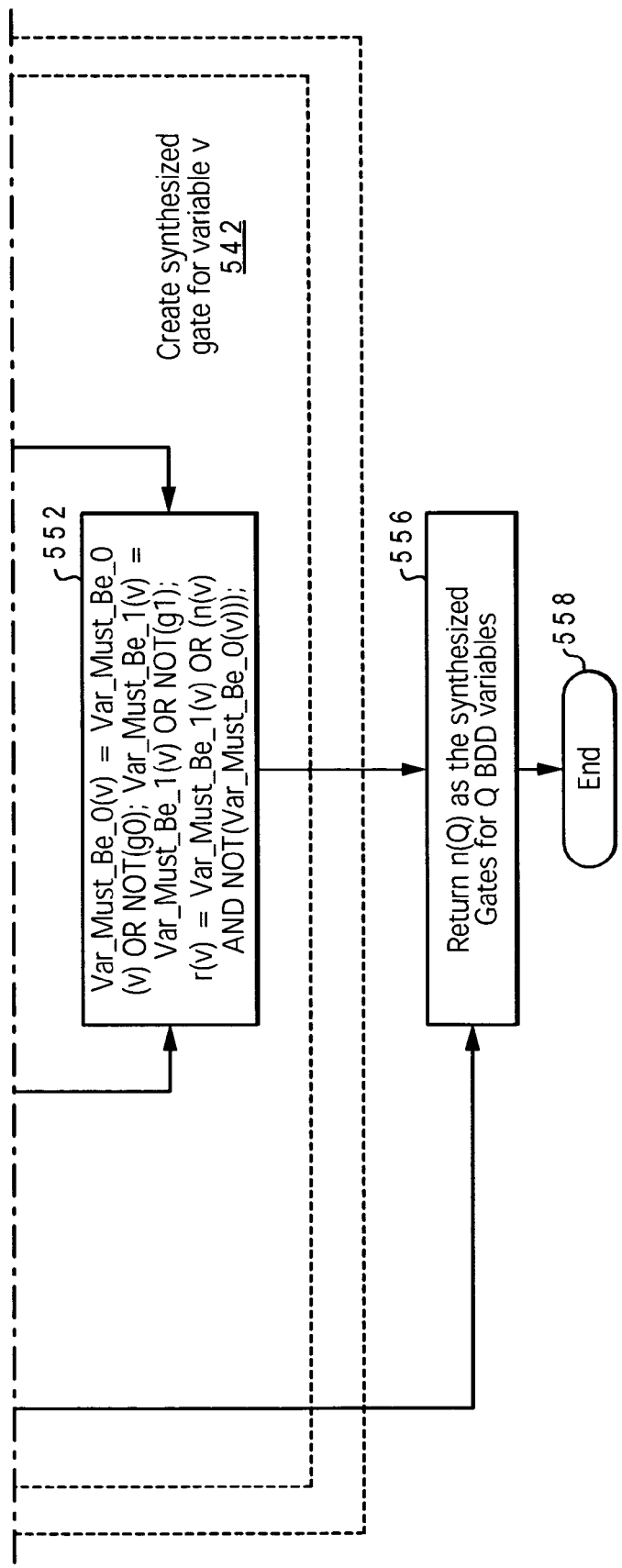

Turning now to FIG. 4, a high-level logical flowchart of a process for preservation of constraints during sequential reparameterization in accordance with a preferred embodiment of the present invention is depicted. The process starts at step 400 and then proceeds to step 402, which depicts verification environment 124 receiving initial design (D) netlist 120, including targets (T) 134, state elements (R) 136, primary inputs (I) 138, and constraints (B) 160. The process next moves to step 404. At step 404, selection unit 156 identifies cut points 140 for a cut (C, C') of initial design (D) netlist 120 where (C') and cut gates (U) 132 are supersets of targets (T) 134 and constraints (B) 160, letting cut gates (U) 132 represent the cut gates sourcing edges from (C) to (C').

The process then proceeds to step 406, which depicts replacement unit 158 computing the relation (S) 142 of values producible to (I, R, U) by existentially quantifying primary inputs (I) 138 from relation (S) 142, resulting in a relation (S) 142 from state elements (R) 136 to cut gates (U) 132. The process next moves to step 408. At step 408, replacement unit 158 constrains relation (S) 142 to force constraint (B) 160 gates in cut gates (U) 132, hereafter referred to as constraint gates in cut gates (BU) 180, to evaluate to one. The process then proceeds to step 410, which depicts replacement unit 158 evaluating set (B') 182 for dead-end states. For each constraint (B) 160 gate in constraint gates in cut gates (BU) 180, replacement unit 158 computes a constraint b' in constraint gates in cut gates (BU) 180 equal to the value of a function existentially_quantify_inputs(b). If b' is not tautologically 1, then b' represents a dead-end state of the applicable constraint (B) 160 gate.

The process next proceeds to step 412. At step 412, replacement unit 158 calculates the inverse of set (B') 182 as 'don't cares' to simplify relation (S) 142. The process then moves to step 414, which depicts replacement unit 158 synthesizing relation (S) 142, forming gate set (C") 146. The process then proceeds to step 416. At step 416, replacement unit 158 synthesizes each of cut gates (BU) 180, forming set B' 182.

The process next proceeds to step 418, which depicts replacement unit 158 forming abstracted design (D') 144 equal to (C", C') with constraints (B) 160 from set (B') 182 and set (C') 176. Gates (U') 148 represent the gates in gate set (C") 146 corresponding to cut gates (U) 132 of 404. The process then proceeds to step 420, which depicts verification environment 124 applying verification to abstracted design (D') 144.

Next, the process moves to step 422. At step 422, verification environment 124 determines whether an abstracted trace (P') 152 hitting targets (T) 134 has been obtained. If verification environment 124 determines that no such abstracted trace is obtained hitting a target (T) 134, then the process next moves to step 430, which depicts verification environment 124 propagating target unhittable results to initial design (D) netlist 120 and reporting results to output table 122. The process then ends at step 432.

If verification environment 124 determines that abstracted trace (P') 152 is obtained which hit a target (T) 134, then the process next moves to step 424. At step 424, verification environment 124 uses simulation to populate trace values to corresponding gates (U') for necessary length (K) to hit targets (T) 134 in abstracted design (D') 144 and defines the resulting abstracted trace (P') 152. The process next moves to step 426, which depicts translation unit 168 casting a k-step satisfiability check to obtain a trace (P''') 150 over (C), witnessing the same sequence of valuations to cut gates (U) 132 seen at corresponding gates (U') 148 in abstracted trace (P') 152. The process next moves to step 428. At step 428, translation unit 168 concatenates values to (C) from trace (P''') with values to (C) from abstracted trace (P') 152 to form unabstracted trace (P) 154, demonstrating a hit of the target in initial design (D) netlist 120. The process then ends at step 432.

Bias unit 174 heuristically preserves the "biases" of RANDOM gates, useful if parametric reduction toolkit 166 for reduction is deployed prior to performing random explicit-state evaluation of initial design (D) netlist 120 (e.g., using verification environment 124 to perform random simulation/emulation or semi-formal verification). It is frequently important to specify specific biases for RANDOM gates which dictate the probability with which they will evaluate to a '1'. For example, a FLUSH type of signal may need to be toggled occasionally to expose certain design flaws, but an assertion of such a signal to '1' may bring initial design (D) netlist 120 back to its reset state. As a result, users may desire to and verification environment 124 will allow them to make such an assertion fairly uncommon. However, the majority of RANDOM gates may be freely toggled without concern for their bias.

Selection of RANDOM gates with biases requiring preservation by bias unit 174 may be done in several ways. For example, bias unit 174 can include any RANDOM gates whose biases are within a specified set of ranges. Bias unit 174 can also preserve a user-specified subset; etc. Bias unit 174 preserves the bias of specified nodes in several steps. Bias unit 174 treats RANDOM gates to be preserved in a manner similar to the treatment of registers by parametric reduction toolkit 166. Selection unit 156 does not include such RANDOM gates to be preserved as sources in the min-cut selection process, preventing the min-cut method from attempting to eliminate them. Selection unit 156 naturally will select cut gates (U) 132 in a manner calculated to attempt to eliminate the remainder of the RANDOM gates, avoiding any suboptimal min-cut choices (e.g., yielding a cut which includes 3 RANDOM gates not to be preserved plus one which is to be preserved, vs. another available cut including 3 RANDOM gates not to be preserved).

Bias unit 174 defines the "nonquantifiable variables" in the binary decision diagram 170-based methods described above in this invention to include not only the register variables, but also the RANDOM gate variables whose biases are to be preserved. Bias unit 174 heuristically attains maximal reductions in RANDOM gates through the abstraction, while preserving the influence of those whose biases need to be fine-tuned.

Figure 7:
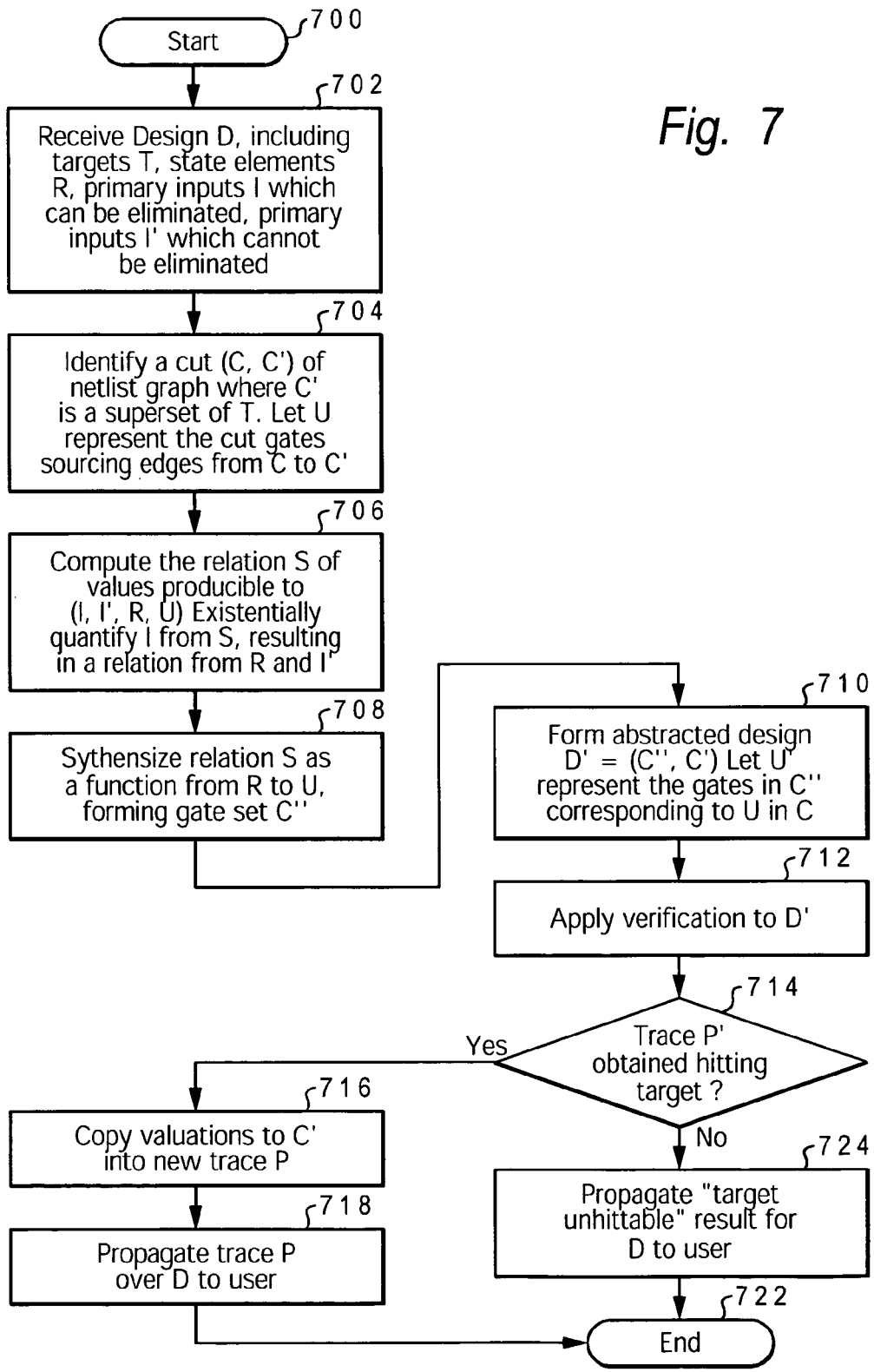
FIG. 7 is a high-level logical flowchart of a process for performing heuristic preservation of critical inputs during sequential reparameterization in accordance with a preferred embodiment of the present invention.

With reference now to FIG. 7, a high-level logical flowchart of a process for performing heuristic preservation of critical inputs during sequential reparameterization in accordance with a preferred embodiment of the present invention is illustrated. The process starts at step 700 and then moves to step 702, which depicts verification environment 124 receiving initial design (D) netlist 120, including targets (T) 134, state elements (R) 136, primary inputs (I) 138 which can be eliminated, and primary inputs (I') which cannot be eliminated. The process next moves to step 704. At step 704, selection unit 156 identifies cut points 140 for a cut (C, C') of initial design (D) netlist 120 where (C') and cut gates (U) 132 are supersets of targets (T) 134. Gates (U) 132 represent the cut gates sourcing edges from (C) to (C').

The process then proceeds to step 706, which depicts replacement unit 158 computing the relation (S) 142 of values producible to (I, I', R, U), then existentially quantifying primary inputs (I) 138 from relation (S) 142, resulting in a relation (S) 142 from state elements (R) 136 and nonquantifiable primary inputs (I') 138 to U. The process next moves to step 708. At step 708, replacement unit 158 synthesizes relation (S) 142, forming gate set (C") 146. The process then proceeds to step 710 which depicts replacement unit 158 forming abstracted design (D') 144 equal to (C", C') and letting corresponding gates (U') 148 represent the gates in gate set (C") 146 corresponding to cut gates (U) 132 in constraints (B) 160. The process then proceeds to step 712, which depicts verification environment 124 applying verification to abstracted design (D') 144.

Next, the process moves to step 714. At step 714, verification environment 124 determines whether an abstracted trace (p') 154 is obtained which hits target (T) 134. If verification environment 124 determines that such a trace has been obtained, then the process next moves to step 724, which depicts verification environment 124 propagating target unhittable results to initial design (D) netlist 120. The process then ends at step 722.

Returning to step 714, if verification environment 124 determines that abstracted trace (p') 154 is obtained which hits target (T) 134, then the process next moves to step 716, which illustrates verification environment 124 copying valuations to set C' 176 into new trace (p) 178. The process then proceeds to step 718. At step 718, verification environment 124 propagates new trace (p) 178 over initial design (D) netlist 120 to the user through output table 122. The process then ends at step 722.

Figure 2:
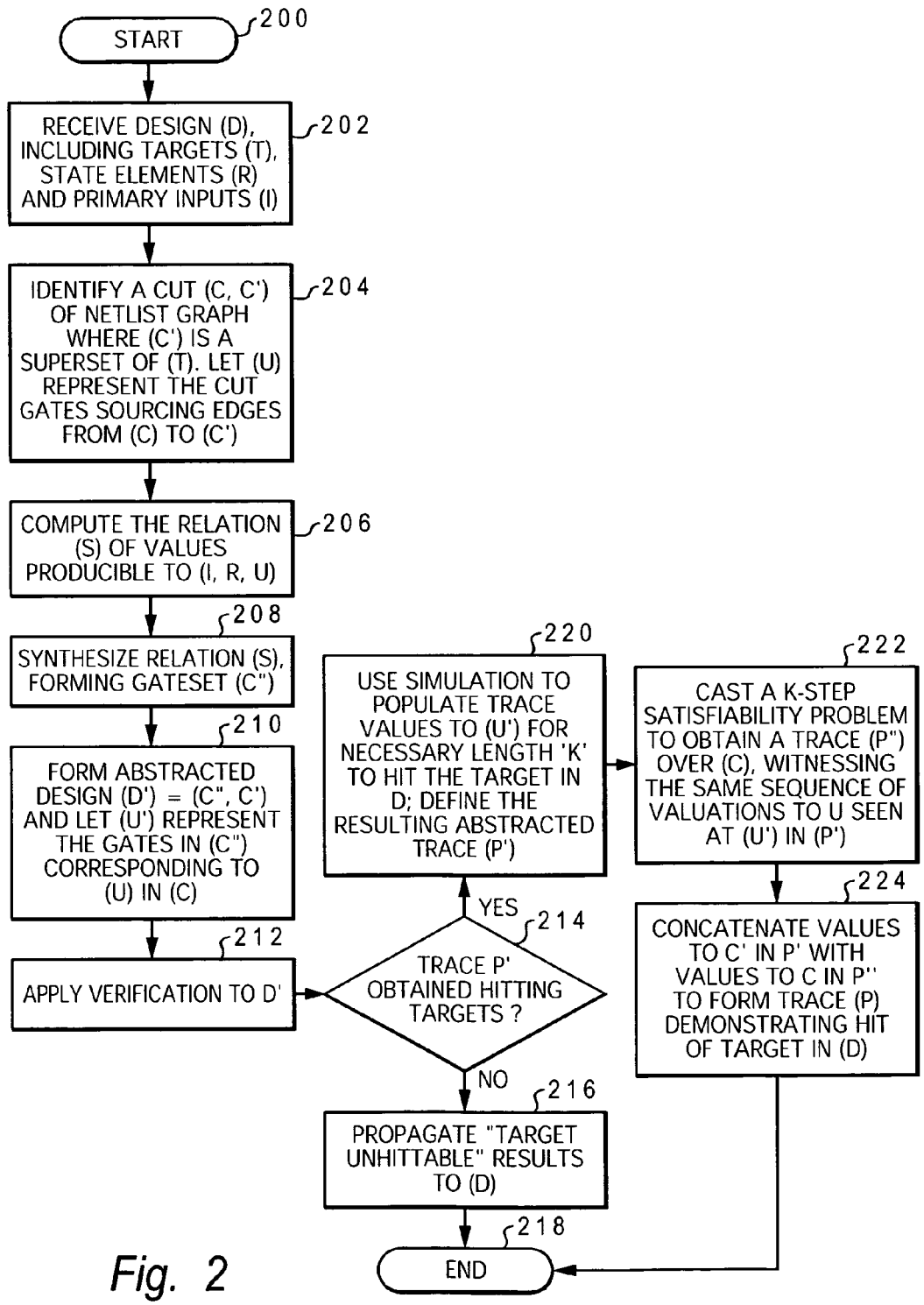
FIG. 2 is a high-level logical flowchart of a process for performing parametric reduction of sequential designs in accordance with an alternative embodiment of the present invention.

Turning now to FIG. 2, a high-level logical flowchart of a process for parametric reduction of sequential designs is depicted. The process starts at step 200 and then proceeds to step 202, which depicts verification environment 124 receiving initial design (D) netlist 120, including targets (T) 134, state elements (R) 136 and primary inputs (I) 138. The process next moves to step 204. At step 204, selection unit 156 identifies cut points 140 for a cut (C, C') of initial design (D) netlist 120 where (C') is a superset of targets (T) 134. Gates (U) 132 represent the cut gates sourcing edges from (C) to (C'). The process then proceeds to step 206, which depicts replacement unit 158 computing the relation (S) 142 of values producible to (I, R, U). The process then moves to step 208. At step 208, replacement unit 158 synthesizes relation (S) 142, forming gate set (C") 146. The process proceeds to step 210 which depicts replacement unit 158 forming abstracted design (D') 144 equal to (C", C'). Gates (U') 148 represent the gates in gate set (C") 146 corresponding to cut gates (U) 132 in constraints (B) 160. The process then proceeds to step 212, which depicts verification environment 124 applying verification to abstracted design (D') 144.

Next, the process moves to step 214. At step 214, verification environment 124 determines whether trace (P') 152 has been obtained which hits target (T) 134. If verification environment 124 determines that no such trace has been obtained, then the process next moves to step 216, which depicts verification environment 124 propagating target unhittable results to initial design (D) netlist 120. The process then ends at step 218.

If verification environment 124 determines that abstracted trace (P') 152 has been obtained which hits target (T) 134, then the process next moves to step 220. At step 220, verification environment 124 uses simulation to populate trace values to corresponding gates (U') for necessary length (K) to hit targets (T) 134 in (D') in abstracted design (D') 144 and defines the resulting abstracted trace (P') 152.

The process next moves to step 222, which depicts translation unit 168, casting a case step satisfiability program to obtain a trace (P''') 150 over (C), witnessing the same sequence evaluations to cut gates (U) 132, seen at corresponding gates (U') 148 in abstracted trace (P') 152. The process next moves to step 224. At step 224, translation unit 168 concatenates values to (C') and trace (P''') with values to (C) in abstracted trace (P') 152 to form unabstracted trace (P) 154, demonstrating hit of target in initial design (D) netlist 120. The process then ends at step 218.

While the invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communication links.

What is claimed is:

1. A method for preserving critical inputs in a digital design, said method comprising:

receiving an initial circuit design including one or more primary inputs which cannot be eliminated, one or more primary inputs which can be eliminated, one or more targets that correlate to one or more properties of said initial circuit design that require verification, and one or more state elements;

identifying a cut of said initial circuit design including one or more cut gates;

computing a relation of one or more values producible to said one or more cut gates in terms of said one or more primary inputs which cannot be eliminated, said one or more primary inputs which can be eliminated and said one or more state elements;

synthesizing said relation to form a gate set, wherein said gate set is behaviorally equivalent to said cut of said initial circuit design;

forming an abstracted circuit design by replacing said cut of said initial circuit design with said gate set; and performing verification on said abstracted circuit design to generate verification results with reference to said initial circuit design.

2. The method of claim 1, wherein said gate set is a first gate set and said step of identifying said cut of said initial circuit design including said one or more cut gates further comprises:

identifying a second gate set which is a subset of said targets.

3. The method of claim 1, further comprising:

determining whether said step of performing verification hit one or more targets; and in response to determining that said step of performing verification did not hit one or more targets, propagating one or more target unhittable results to said initial circuit design.

4. The method of claim 1, further comprising:

determining whether said step of performing verification hit one or more targets; and in response to determining that said step of performing verification hit one or more targets, copying one or more valuations to a third gate set into a new trace.

5. The method of claim 3, further comprising:

in response to determining that said step of performing verification hit one or more targets propagating said new trace over said initial circuit design to a user.

6. The method of claim 1, wherein said step of synthesizing said relation to form said first gate set further comprises:

synthesizing said relation as a function from said state elements and said primary inputs which cannot be eliminated to said cut gates.

7. The method of claim 1, wherein said step of computing said relation of said one or more values producible to said one or more state elements at said one or more cut gates in terms of said one or more primary inputs further comprises:

existentially quantifying said primary inputs which can be eliminated from said relation.

* * * * *